United States Patent
Hoshuyama

(10) Patent No.: US 6,449,586 B1
(45) Date of Patent: Sep. 10, 2002

(54) CONTROL METHOD OF ADAPTIVE ARRAY AND ADAPTIVE ARRAY APPARATUS

(75) Inventor: Osamu Hoshuyama, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/127,189

(22) Filed: Jul. 31, 1998

(30) Foreign Application Priority Data

Aug. 1, 1997 (JP) .............................................. 9-207990

(51) Int. Cl.[7] ................................................. H03F 1/26
(52) U.S. Cl. ........................................ 702/190; 381/92
(58) Field of Search ................................. 702/190, 191, 702/193, 194, 196; 381/92, 71, FOR 103, FOR 107, FOR 110, FOR 137, FOR 141, FOR 150

(56) References Cited

U.S. PATENT DOCUMENTS

| | | | | |
|---|---|---|---|---|
| 4,536,887 A | * | 8/1985 | Kaneda et al. | 381/92 |
| 4,802,227 A | * | 1/1989 | Elko et al. | 381/92 |
| 5,473,701 A | * | 12/1995 | Cezanne et al. | 381/92 |
| 5,475,761 A | * | 12/1995 | Eatwell | 381/71.11 |

FOREIGN PATENT DOCUMENTS

| | | |
|---|---|---|
| JP | 5-52923 | 3/1993 |
| JP | 6-347539 | 12/1994 |
| JP | 8-122424 | 5/1996 |
| JP | 8-213880 | 8/1996 |
| JP | 8-265223 | 10/1996 |

OTHER PUBLICATIONS

Japanese Office Action issued Mar. 12, 2001 in a related application with English translation of relevant portions.

L.J. Griffiths, et al., "An Alternative Approach to Linearly Constrained Adaptive Beamforming", IEEE Transactions on Antennas and Propagation, vol. AP–30, No. 1, Jan. 1982, pp. 27–34.

I. Claesson, et al., "A Spatial Filtering Approach to Robust Adaptive Beaming", IEEE Transactions on Antennas and propagation, vol. 40, No. 9, Sep. 1992, pp. 1093–1096.

(List continued on next page.)

Primary Examiner—Marc S. Hoff
Assistant Examiner—Mohamed Charioui
(74) Attorney, Agent, or Firm—Dickstein, Shapiro, Morin & Oshinsky, LLP.

(57) ABSTRACT

An adaptive array apparatus can follow high speed movement of an interference signal source with reducing breathing noise and maintaining high quality of an output signal. The adaptive array apparatus uses an indicative value relating to an amplitude of an output signal of a beam former having higher sensitivity with respect to the target signal source than a sensitivity with respect to other signal source, and an indicative value relating to an amplitude of an output signal of a beam former having lower sensitivity with respect to the target signal source than a sensitivity with respect to other signal source, and determines a step size of an adaptive algorithm in the adaptive filter. Thus, even when a constant determining a step size is set large for making following speed with respect to the movement of the interference signal source higher to reduce signal degradation and breathing noise.

19 Claims, 31 Drawing Sheets

OTHER PUBLICATIONS

O.L. Frost, III, "An Algorithm for Linearly Constrained Adaptive Array Processing", Proceedings of the IEEE, vol. 60, No. 8, Aug. 1972, pp. 926–935.

S. Affes, et al., "Robust Adaptive Beamforming Via LMS–Like Target Tracking", IEEE, Processings of International Conference on Acoustics, Speech and Signal Processing, 1994, pp. IV–269–IV–272.

D.H. Johnson, et al., "Array Signal Processing—Concepts and Techniques", Prentice Hall, Englewood Cliffs, 1993, Chapter 4, pp. 156–191.

O. Hoshuyama, et al., "A Robust Generalized Sidelobe Canceller With A Blocking Matrix Using Leaky Adaptive Filters", Electronics and Communications in Japan, Part 3, vol. 80, No. 8, 1997, pp. 56–65.

* cited by examiner

CONTROL METHOD OF ADAPTIVE ARRAY AND ADAPTIVE ARRAY APPARATUS

BACKGROUND OF THE INVENTION

1. Field of the Invention

The present invention relates to a control method of adaptive array and an adaptive array apparatus for receiving a signal in spatially selective manner employing a plurality of sensors.

2. Description of the Related Art

In a field of obtaining a voice signal, sonar, radio communication and so forth, in order to receive only a specific signal among a plurality of signal sources, a voice enhancing device employing an adaptive microphone array, a radio signal transmitting and receiving device employing an adaptive antenna array and so forth are known as application of an adaptive array technology.

As sensor, a microphone, an ultrasonic sensor, a sonar receiver, antenna and so forth may be employed. Discussion will be given hereinafter for the case where the microphone is used as the sensor.

Here, for simplification of disclosure, consideration is given for the case where the microphones are aligned with equal interval. On the other hand, a target sound source is considered to be located sufficiently distant from a line, on which the microphones are arranged. Also, a situation where the target sound source is arranged perpendicularly to the line on which the microphones are aligned.

A microphone array forms a spatial filter by summing signals sounded by a plurality of microphones after filtering. By such spatial filter, an environmental noise can be suppressed to permit reception of signal arriving from a predetermined direction, namely only a target sound. The adaptive microphone array is a microphone array which adaptively varies spatial filtering characteristics. As constructions of the adaptive microphone array, a construction disclosed in "Generalized Side Lobe Canceller", IEEE, Transactions on Antennas and Propagation, Vol. 30, No. 1, 1982, pp 27 to 34 (hereinafter referred to as "publication 1"), a construction disclosed in IEEE, Transactions on Antennas and Propagation, Vol. 40, No. 9, 1992, pp 1093 to 1096 (hereinafter referred to as "publication 2"), a construction disclosed in Paper of The Institute of Electronics. Information and Communication Engineers, Vol. 79, No. 9, 1966, pp 1516 to 1524 (hereinafter referred to as "publication 3"), a construction shown in "Frost Beam Former", IEEE, Processing of IEEE, Vol. 60, No. 8, 1972, pp 926 to 935, a construction disclosed in IEEE, Processings of International Conference on Acoustics, Speech and Signal Processing 94, 1994, pp IV-267 to 272 (hereinafter referred to as "publication 5") and so forth are known.

Here, discussion will be given for operation of the construction of the publication 3 as typical construction, with reference to the drawing.

FIG. 35 shows a signal processing portion of an adaptive array of the publication 3, when M microphones are employed. Signals of a microphone group $1m$ (m=0, 1, ..., M−1) are converted from analog signals into digital signals, respectively. This digital signal group (hereinafter referred to as microphone signal group) is subject to signal processing to extract a target signal.

The conventional adaptive array device is constructed with a fixed beam former 2, a blocking matrix 20, a multi-input canceller 30. Hereinafter, each of the fixed beam former 2, the blocking matrix 20 and the multi-input canceller 30 will be discussed individually.

As the fixed beam former, a delay and sum beam former which delays and sums signals received from the microphone group and a filter and sum beam former which filters and sums the signals received from the microphone group. Such fixed beam former has been disclosed in D. H. Johnson and D. E. Dudgeon, "Array Signal Processing" (Prentice Hall, Englewood Cliffs, 1993, Chapter 4 (hereinafter referred to as "publication 6"). Here, the operation will be discussed in terms of the delay and sum beam. The delay and sum beam former can be expressed by the following expression (1).

$$g(k) = \sum_{m=0}^{M-1} f_m x_m(k - r_m) \tag{1}$$

wherein k is a sample number in a time axis, and rm is a delayed sample number of respective microphone signals xm(k). g(k) is an output signal of the fixed beam former 2, xm(k) is an output signal of a microphone Im, fm is a coefficients corresponding to the microphone signal in the fixed beam former.

The delay and sum beam former calculates and outputs a sum of the signals multiplied with the coefficients fm with delaying respective microphone signals xm(k) for rm samples. Each delay period rm is set to synchronize the phase of the target signal in a signal xm (k−rm) which is generated by delaying output signals of respective microphones Im. As a result, upon summing xm (k−rm) (m=0, 1, ..., M−1), the target signal is enhanced. On the other hand, interference signals arrive from directions other than target signal. In the signal xm (k−rm) which is generated by delaying the output signal of each microphone, a phase is significantly different. Upon summing, the signals are canceled with each other to attenuate. Accordingly, in the output of the fixed beam former, the target signal is enhanced and the interference signal is attenuated.

Next, the blocking matrix 20 will be discussed with reference to FIG. 35.

The blocking matrix 20 is constructed with a fixed beam former 3, a delay group $4m$(m=0, 1, M−1), an adaptive filter group $5m$(m=0, 1, ..., M−1), a subtractor group $6m$(m=0, 1, ..., M−1). The blocking matrix 20 is employed for adaptive signal processing to transmit a signal group, in which the target signal is attenuated and the signals other than the target signal are enhanced to the multi-input canceller 30.

As a filter structure of the adaptive filter group $5m$ of the blocking matrix 20, a finite impulse response (FIR) filter, an infinite impulse response (IIR) filter, lattice filter and so forth can be employed. Here, discussion will be given for the case where the FIR filter is employed.

The fixed beam former 3 receives the signal group from the microphone 1 and outputs a signal, in which the target signal is enhanced and the interference signals are attenuated by signal processing similar to the fixed beam former 2. The output signal of the fixed beam former 3 becomes an input signal common to the adaptive filters $5m$. Each delay $4m$ receives the output signal of corresponding one of the microphone $1m$ to transmit the delayed signal to corresponding one of the subtractor $6m$. Each of the adaptive filters $5m$ receives the output signal of the fixed beam former 3 and transmits an output signal, in which a tap coefficients contained in the corresponding adaptive filter $5m$ is convoluted, to the corresponding subtractor $6m$. Each subtractor $6m$ subtracts the output signal of the corresponding adaptive filter $5m$ from the output signal of the corresponding delay 4*m*. A result of subtraction of the subtractor 6*m* is transmitted to the corresponding adaptive filter 7*m* of the multi-input canceller 30 as the output signal of the blocking matrix 20, and, in conjunction therewith, to the corresponding adaptive filter 5*m* for updating the tap coefficients.

A delay period of the delay 4*m* is set so that phases of a target signal component in the output of the delay 4 m and a target signal component in the output of the adaptive filter 5*m* are consistent with each other. For example, the delay period of the delay 4*m* may be set at a period as a sum of a group delay period of the fixed beam former 3 and a period of about one fourth to one half of a period corresponding to a tap number of the adaptive filter 5*m*.

The process in the blocking matrix can be expressed by the following expression (2)

$$y_m(k) = x_m(k-P) - H_m^T(k)D(k) \quad (m=0,1,\ldots,M-1) \qquad (2)$$

wherein ym(k) is an output signal of the subtractor group 6*m*, xm(k−P) is an output signal of the delay 4*m*, P is a delay period of the delay 4*m*. Also, $\{\cdot\}^T$ represents transpose. Hm(k) is a tap coefficients vector of the adaptive filter 5*m*, D(k) is a signal vector consisted of a plurality of signals generated by delaying the output signal d(k) of the fixed beam former 3 which is expressed as the following expressions (3) and (4) assuming that the tap number is N.

$$H_m(k) = [h_{m,0}(k), h_{m,1}(k), \ldots h_{m,N-1}(k)]^T \quad (m=0,1,\ldots,M-1) \qquad (3)$$

$$D(k) = [d(k), d(k-1), \ldots, d(k-N+1)]^T \qquad (4)$$

Hereinafter, detailed discussion of the adaptive filter 5*m* will be given.

As the adaptive filter 5*m*, updating of the tap coefficients is performed so that an output signal power of the subtractor 6*m* can be minimized. Hereinafter, updating of the coefficients in the adaptive filter 5*m* will be discussed in detail.

As an algorithm adapted for updating the tap coefficients in the adaptive filter 5*m*, an NLMS algorithm (also called as "learning identification method"), RLS algorithm (also called as "recursive least square method"), a projection algorithm, a gradient method, a least square method, a block adaptive algorithm, adaptive algorithm employing orthogonal transformation and so forth may be used. A discussion will be given hereinafter for the case where NLMS algorithm is employed as the adaptive algorithm.

Updating of the tap coefficients Hm(k) (m=0, 1, . . . ) M−1) of the leak adaptive filter employing the NLMS algorithm can be expressed by the following expressions (5) and (6).

$$H_m(k+1) = H_m(k) - \delta H_m(k) + \beta y_m \frac{(k)}{\|D(k)\|^2} D(k) \qquad (5)$$

$$(m = 0, 1, \ldots, M-1)$$

$$0 < \beta < 2 \qquad (6)$$

wherein β is a constant determining a step size, δ is leaky coefficients. In updating of the tap coefficients, the constant β determining the step size becomes the step size as is.

Updating of the tap coefficients of each adaptive filter 5*m* is performed for minimizing the power of the signal in the output of the corresponding subtractor 6*m*. The output signal of the fixed beam former 3 as the input signal of the adaptive filter 5*m* mainly contain the target signal. Therefore, as a result of minimization of the output signal power of each subtractor 6*m*, the target signal is significantly attenuated at the output of the subtractor 6m.

Subsequently, discussion will be given with respect to the multi-input canceller 30.

The multi-input canceller 30 receives the output signal of the fixed beam former 2 and the output signal group of the blocking matrix 20 to eliminate a component correlated with the output signal group of the blocking matrix 20 from the signal derived by delaying the output of the fixed beam former 2.

The multi-input canceller 30 is constructed with adaptive filter group 7*m* (m=0, 1, . . . ) M−1) corresponding to the output signals of respective subtractor group 6*m*, an adder 8*m* a delay 11 and a subtractor 9.

Each adaptive filter 7*m* receives the output signal of corresponding subtractor 6*m* to transmit filter coefficients and convolution result to the adder 8 as the output signal. As a filter structure of the adaptive filter 7*m*, an FIR filter, an IIR filter, a lattice filter and so forth can be employed. Here, discussion will be given hereinafter for the case where the FIR filter is employed.

The adder 8 receives all of the outputs of the adaptive filter group 7*m* to derive a sum of the received signal for outputting as a result to the subtractor 9.

The delay 11 receives the output signal of the fixed beam former 2 and transmits the delayed signal to the subtractor 9.

The subtractor 9 subtracts the output signal of the adder 8 from the output signal of the delay 11. The output signal of the subtractor 9 becomes the output of the multi-input canceller 30, namely the output of the overall adaptive array apparatus.

A delay period Q of the delay 11 is set to make the phase of the signals to be consistent in the output of the adaptive filter 7*m* and the output of the delay 11 with respect to arbitrary direction of arrival. For example, the delay period Q is set to a period from one fourth to three fourth of tap number of the adaptive filter 7*m*.

The process in the multi-input canceller 30 can be expressed by the following expression (7).

$$z(k) = g(k-Q) - \sum_{m=0}^{M-1} W_m^T(k) Y_m(k) \qquad (7)$$

wherein g(k−Q) is an output of the delay 11, namely as a signal derived by delaying the output signal of the fixed beam former 2. On the other hand, z(k) is the output signal of the subtractor 9, namely the output signal of the overall adaptive array. Also, Wm(k) is a tap coefficients vector of the adaptive filter 7*m*, Ym(k) is the input signal of the adaptive filter 7*m*, namely a signal vector consisted of a signal derived by delaying the output signal ym(k) of the blocking matrix. Wm(k) and Ym(k) are defined as following expressions (8) and (9) with taking the tap number being L.

$$W_m(k) = [w_{m,0}(k), w_{m,1}(k), \ldots, w_{m,L-1}(k)]^T \qquad (8)$$

$$Y_m(k) = [y_m(k), y_m(k-1), \ldots, y_m(k-L+1)]^T \quad (m=0,1,\ldots,M-1) \qquad (9)$$

In each adaptive filter 7*m*, on the basis of the output signal of the subtractor 9, the tap coefficients Wm(k) is updated so that the power of the output signal z(k) of the subtractor 9 is minimized. The adaptive filter 7*m* will be discussed hereinafter in detail.

As the adaptive filter 7*m*, a tap coefficients constrained adaptive filter or leaky adaptive filter may be employed.

Here, discussion will be given for the case where the leaky adaptive filter is employed.

As adaptive algorithm for updating the tap coefficients in the adaptive filter $7m$, the NLMS algorithm, the RLS algorithm, the projection algorithm, the gradient method, the least square method, the block adaptive algorithm, the adaptive algorithm employing orthogonal transformation and so forth may be used. A discussion will be given hereinafter for the case where NLMS algorithm is employed as the adaptive algorithm.

When the NLMS algorithm is applied as the adaptive algorithm, there are a method applying NLMS algorithm per each adaptive filter and a method applying NLMS algorithm aggregatingly for all adaptive filter group. Here, discussion will be given for the method applying NLMS algorithm aggregatingly for all adaptive filter group.

Updating of coefficients of the tap coefficients $W_m(k)$ in the adaptive filter group $7m$ can be expressed by the following expression (10) with taking the constant determining the step size being $\alpha$.

$$W_m(k+1) = W_m(k) - \gamma W_m(k) + \alpha \frac{z(k)}{\sum_{m=0}^{M-2} \|Y_m(k)\|^2} Y_m(k) \quad (10)$$

$$(m = 0, 1, \ldots, M-1)$$

wherein $\|\cdot\|$ is an Euclidean norm, $\gamma$ is a leaky coefficients. In updating of coefficients, the constant $\alpha$ determining the step size becomes the step size as is.

Updating of the tap coefficients of the adaptive filter group $7m$ is performed for minimizing the output of the signal at the output of the subtractor 9. The output signal of the subtractor $6m$ as the input signal of each adaptive filter $7m$ mainly contain the interference signal. Therefore, as a result of minimization of the output signal power of the subtractor 9, the interference signal is significantly attenuated in the output of the subtractor 9.

The conventional adaptive array apparatus set forth above can extract the target signal in the under presence of the interference signal.

In the conventional adaptive array apparatus, when only target signal is present and the interference signal is not present, the tap coefficients $W_m(k)$ in the adaptive filter group $7m$ of the multi-input canceller 30 can be disturbed by the target signal to cause degradation of the target signal at the final output. On the other hand, when the interference signal is generated again after disturbance of the filter coefficients $W_m(k)$, the interference signal cannot be removed to cause breathing noise in the final output.

For presenting degradation or noise, it becomes necessary to set the constant $\alpha$ for determining the step size of the adaptive algorithm small so as not to disturb the adaptive filter group $7m$ of the multi-input canceller 30. However, when $\alpha$ is small, a following speed of the adaptive filter group $7m$ in the multi-input canceller 30 relative to movement of the interference signal source, becomes low to elongate period, in which removal of the interference signal is unsatisfactory in the final output.

On the other hand, when only interference signal is present and the target signal is not present, the filter coefficients $H_m(k)$ in the adaptive filter group $5m$ of the blocking matrix 20 is disturbed to cause breathing noise in the final output. In order to prevent this, it becomes necessary to make the constant $\beta$ determining the step size of the adaptive algorithm small in order to avoid disturbance of the adaptive filter $5m$. However, when $\beta$ is small, following speed of the adaptive filter group $5m$ in the blocking matrix 20 with respect to movement of the target signal source, becomes low to cause degradation of quality of the target signal in the final output.

In the conventional adaptive array apparatus, in order to make breathing noise smaller or to make the quality of the output signal higher, it becomes necessary to set the constant determining the step size smaller in the adaptive filter of the multi-input canceller. On the other hand, for making following speed for movement of the interference signal source high, the constant has to be set large. Thus, in the conventional adaptive array apparatus, in setting of the constant determining the step size in the adaptive filter of the multi-input canceller, reducing of the breathing noise, enhancing quality of the output signal and making the following speed with respect to movement of the interference signal source high are in a relationship of trade-off.

On the other hand, in the conventional adaptive array apparatus, it becomes necessary to make the constant determining the step size in the adaptive filter of the blocking matrix small. On the other hand, in order to obtain high following speed for movement of the target signal source, the constant has to be set greater. Thus, in the conventional adaptive array apparatus, in setting of the constant determining the step size in the adaptive filter of the blocking matrix, reducing of the breathing noise and making the following speed with respect to movement of the interference signal source high are in a relationship of trade-off.

SUMMARY OF THE INVENTION

It is an object of the present invention to provide a control method of adaptive array and an adaptive array apparatus which can obtain high following speed with respect to movement of an interference signal source with maintaining a breathing noise small and quality of an output signal high.

According to the first aspect of the present invention, a control method of an adaptive array employing an adaptive filter for receiving a particular signal source as a target signal source, among a plurality of signal sources, comprises the steps of:

using an indicative value relating to an amplitude of an output signal of a beam former having higher sensitivity with respect to the target signal source than a sensitivity with respect to other signal source;

using an indicative value relating to an amplitude of an output signal of a beam former having lower sensitivity with respect to the target signal source than a sensitivity with respect to other signal source; and determining a step size of an adaptive algorithm in the adaptive filter.

The present invention in the foregoing first aspect uses the indicative value relating to an amplitude of an output signal of a beam former having higher sensitivity with respect to the target signal source than a sensitivity with respect to other signal source and the indicative value relating to an amplitude of an output signal of a beam former having lower sensitivity with respect to the target signal source than a sensitivity with respect to other signal source for determining the step size of the adaptive algorithm in the adaptive filter.

Accordingly, even when a constant $\alpha$ determining the step size of the adaptive filter is set large, degradation of the signal and breathing noise in the final output can be suppressed and breathing noise due to movement of the interference signal source can be suppressed with higher following speed with respect to movement of the interference signal source.

According to the second aspect of the present invention, an adaptive array apparatus employing an adaptive filter for receiving a particular signal source as a target signal source, among a plurality of signal sources, comprises:

means for deriving a first indicative value relating to an amplitude of an output signal of a beam former having higher sensitivity with respect to the target signal source than a sensitivity with respect to other signal source;

means for deriving a second indicative value relating to an amplitude of an output signal of a beam former having lower sensitivity with respect to the target signal source than a sensitivity with respect to other signal source; and means for determining a step size of an adaptive algorithm in the adaptive filter on the basis of a radio of the first and second indicative values.

According to the third aspect of the present invention, an adaptive array apparatus employing an adaptive filter for receiving a particular signal source as a target signal source, among a plurality of signal sources, comprises:

means for deriving a first indicative value relating to an amplitude of an output signal of a beam former having higher sensitivity with respect to the target signal source than a sensitivity with respect to other signal source, means for deriving a second indicative value relating to an amplitude of an output signal of a beam former having lower sensitivity with respect to the target signal source than a sensitivity with respect to other signal source;

means for comparing the first indicative value and an value derived by multiplying the second indicative value with a constant; and means for determining a step size of an adaptive algorithm in the adaptive filter on the basis of a result of comparison of the first and second indicative values.

The third aspect of the present invention set forth above compares the first indicative value and an value derived by multiplying the second indicative value with a constant of the second indicative value to determine the step size of the adaptive algorithm of the adaptive filter.

Accordingly, by setting a constant by deriving an value derived by multiplying the second indicative value with a constant, a threshold value for determining whether the filter coefficients is to be updated or not, can be set.

According to the fourth aspect of the present invention, an adaptive array apparatus having a generalized side lobe canceller type construction and having an adaptive filter for receiving only specific signal source as a target signal source among a plurality of signal sources, comprises:

means for deriving a first indicative value relating to an amplitude of an output signal of a beam former having higher sensitivity with respect to the target signal source than a sensitivity with respect to other signal source;

means for deriving a second indicative value relating to an amplitude of an output signal of a beam former having lower sensitivity with respect to the target signal source than a sensitivity with respect to other signal source;

means for deriving a step size determining value proportional to a value derived by converting a quotient of division of the first indicative value by the second indicative value with a non-linear function; and means for determining a step size of an adaptive algorithm in an adaptive filter provided in a multi-input canceller on the basis of the step size determining value.

In the construction set forth above, with a step size determining value proportional to a value derived by converting a quotient of division of the first indicative value by the second indicative value with a non-linear function, the step size of an adaptive algorithm in an adaptive filter is determined on the basis of the step size determining value.

Accordingly, when the target signal is sufficiently large and the interference signal is sufficiently small, the quotient by dividing the first indicative value by the second indicative value becomes a positive value close to zero to increase period to perform updating of the tap coefficients to make converging speed of the adaptive filter higher.

In the preferred construction, the non-linear function is a step function.

In the alternative, the non-linear function may be a diode function.

In the further alternative, the non-linear function may be a polynomial function.

Also, in the preferred construction, each of the first and second indicative values relating to the signal amplitude is an average value of square of the signal.

In the alternative, each of the first and second indicative values relating to the signal amplitude may be an average value of absolute value of the signal.

In the further alternative, each of the first and second indicative values relating to the signal amplitude is an average value of a given order power of the signal.

According to the fifth aspect of the present invention, a control method for an adaptive array apparatus employing an adaptive filter and an iterative least square algorithm for receiving a particular signal source as a target signal source, among a plurality of signal sources, comprises the steps of:

deriving a first indicative value relating to an amplitude of an output signal of a beam former having higher sensitivity with respect to the target signal source than a sensitivity with respect to other signal source, deriving a second indicative value relating to an amplitude of an output signal of a beam former having lower sensitivity with respect to the target signal source than a sensitivity with respect to other signal source; and determining a step size of an adaptive algorithm in the adaptive filter and a forgetting constant on the basis of the first and second indicative values.

According to the sixth aspect of the present invention, an adaptive array apparatus employing an adaptive filter and an recursive least square algorithm for receiving a particular signal source as a target signal source, among a plurality of signal sources, comprises:

means for deriving a first indicative value relating to an amplitude of an output signal of a beam former having higher sensitivity with respect to the target signal source than a sensitivity with respect to other signal source, means for deriving a second indicative value relating to an amplitude of an output signal of a beam former having lower sensitivity with respect to the target signal source than a sensitivity with respect to other signal source; and means for determining a step size of an adaptive algorithm in the adaptive filter and a forgetting constant on the basis of the first and second indicative values.

With the invention set forth above, the present invention is applicable for the adaptive filter having the recursive least square algorithm using the forgetting constant.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

First Embodiment

Figure 1:
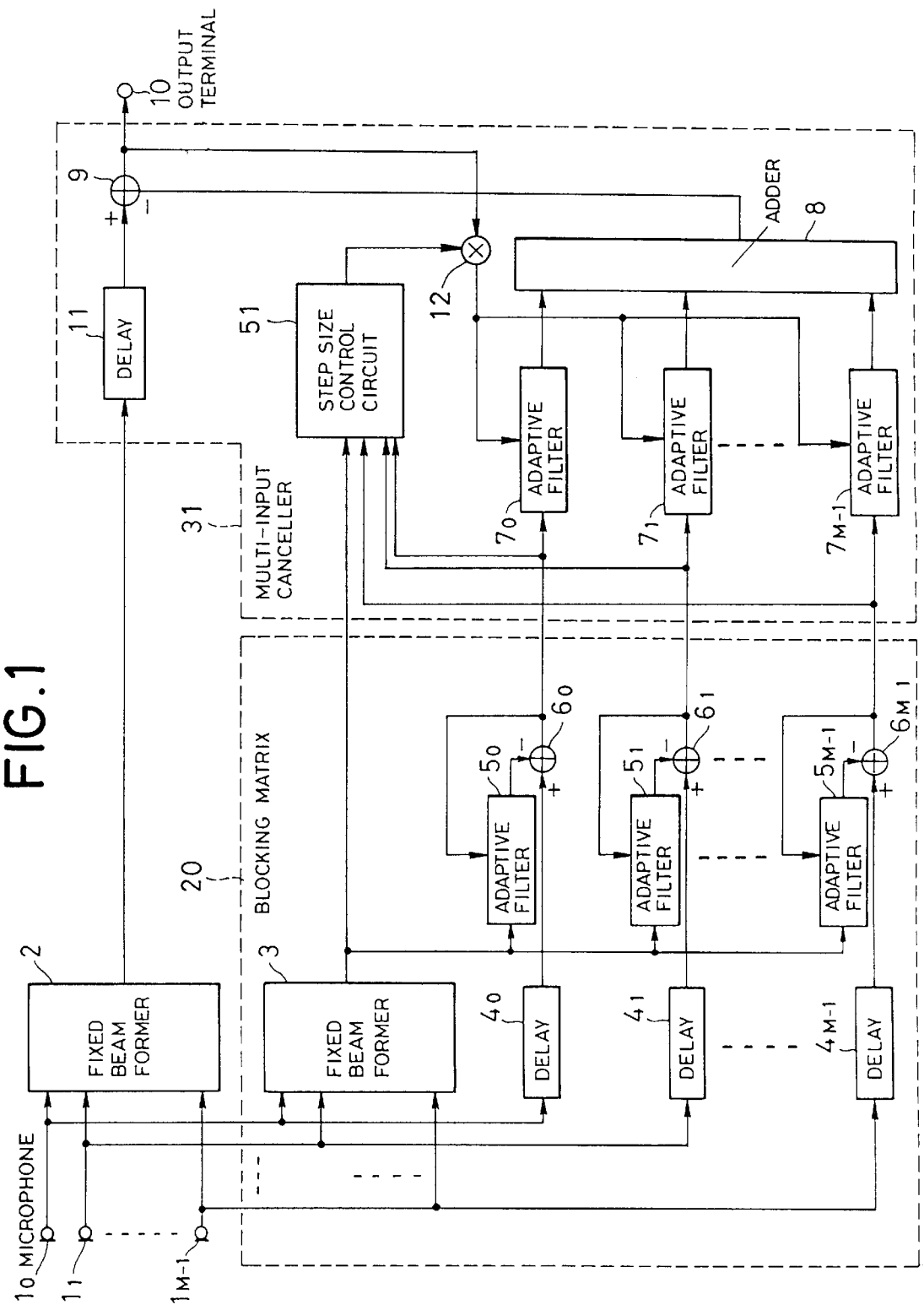
FIG. 1 is a block diagram showing a construction of the first embodiment of an adaptive array apparatus according to the present invention.

FIG. 1 is a block diagram of the first embodiment of an adaptive array apparatus according to the present invention. The shown embodiment is constructed by replacing the multi-input canceller 30 with a multi-input canceller 31, for which a step size control circuit 51 is added, and inserting a multiplier 12 in a path from the subtractor 9 to respective adaptive filters 7*m*, for the construction of the conventional adaptive array apparatus shown in FIG. 33. Hereinafter, operation of the step size control circuit 51 and the multiplier 12 and the result thereof will be discussed.

The step size control circuit 51 receives the output signal of the fixed beam former 3 to calculate an amplitude or an indicative value relating thereto (hereinafter referred to as "amplitude indicative value"), receives an output signal group of the blocking matrix 20 to calculate the amplitude indicative value, and compares two indicative values to calculate and output a step size control coefficients to transmit to the multiplier 12.

The multiplier 12 multiplies the signal received from the corresponding subtractor 9 by the step size control coefficients received from the step size control circuit 51 to transmit to respective adaptive filters 7m.

Accordingly, tap coefficients updating amounts of respective adaptive filters 7m is proportional to the step size control coefficients output by the step size control circuit 51. Namely, a value derived by multiplying the constant α determining the step size with the step size control coefficients, becomes the step size.

Figure 2:
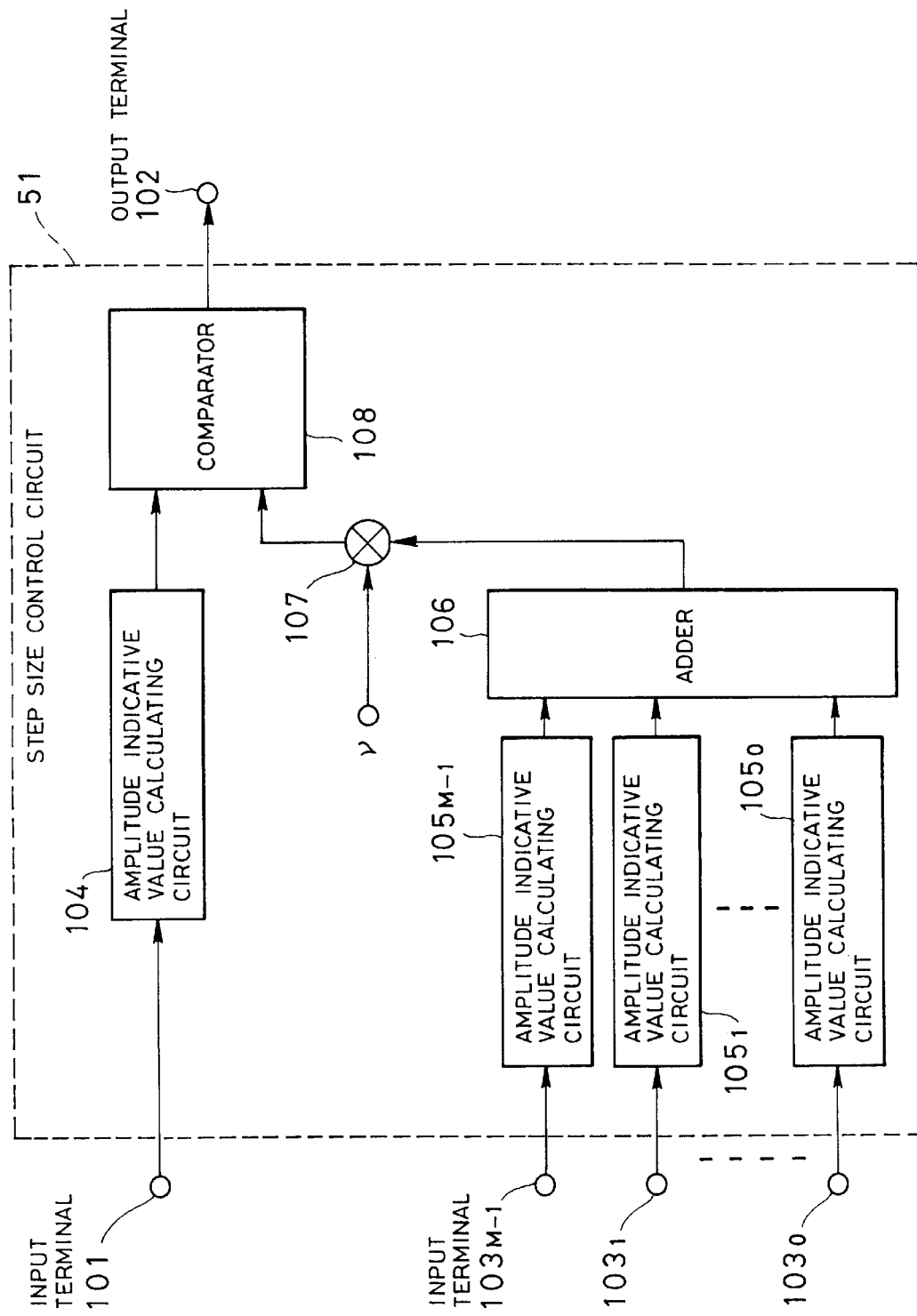
FIG. 2 is a block diagram showing a construction of a step size control circuit 51 of FIG. 1.

FIG. 2 shows one example of a construction of the step size control circuit in the first embodiment. Hereinafter, the operation of the step size control circuit 51 will be discussed with reference to FIG. 2, 33 and 34.

The output signal of the fixed beam former 3 in FIG. 1 is transmitted to an amplitude indicative value calculating circuit 104 through an input terminal 101. The amplitude indicative value calculating circuit 104 calculates an amplitude indicative value of the signal received from the input terminal 101 to transmit a result of calculation to a comparator 108 (S1). On the other hand, a group of output signals of the blocking matrix 20 in FIG. 1 are respectively transmitted to power indicative value calculating circuits 105m through respectively corresponding input terminals 103m. Respective amplitude indicative value calculating circuits 105m receive the corresponding signals and calculate amplitude indicative values to transmit the results of calculation to an adder 106 (S2). The adder 106 calculates a sum of the signals received from the amplitude indicative value calculating circuits 105m to transmit the result of calculation to a multiplier 107 (S3). The multiplier 107 multiplies the signal from the adder 106 with a constant ν to transmit the result of calculation to the comparator 108 (S4). In the comparator 108, the value received from the amplitude indicative value calculating circuit 104 and a value received from the multiplier 107 are compared (S5) to output zero (S6) when the value received from the amplitude indicative value calculating circuit 104 is greater than the value received from the multiplier 107 and to output one otherwise (S7). An output of the comparator 108 becomes an output of the step size control circuit 51.

The amplitude indicative value calculating circuits 104 and 105m calculate amount monotone increasing relative to the amplitude of the input signal for outputting. As the amplitude indicative value, a time-average of an instantaneous square value, a time-average of an instantaneous absolute value, a time-average of an absolute value of an instantaneous cubic value, a time-average of an instantaneous biquadratic value and so forth may be employed. Here, operation of the amplitude indicative value calculating circuit will be discussed with taking the time-average of the instantaneous square value, namely a case where a power prediction value is used.

Figure 3:
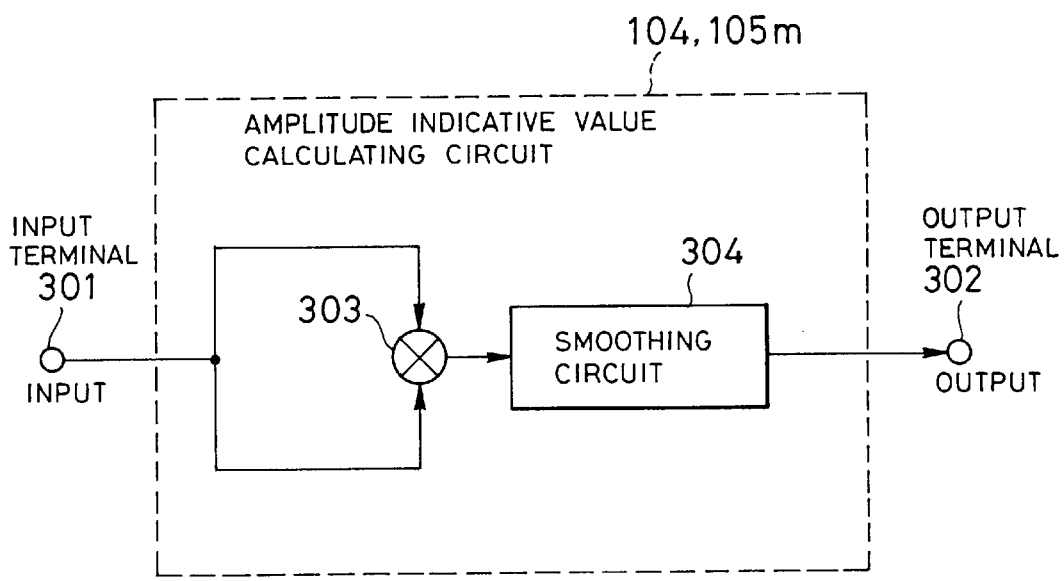
FIG. 3 is an illustration showing one example of amplitude indicative value calculating circuits 104 and 105*m* of FIG. 2.

FIG. 3 shows one example of a construction of the amplitude indicative value calculating circuit. FIG. 3 shows the case where a time-average of the instantaneous square value, namely the power prediction value is used as the amplitude indicative value. The input signal is transmitted to two inputs of a multiplier 303 via an input terminal 301. In the multiplier 303, two inputs are multiplied to transmit the result to a smoothing circuit 304. In the smoothing circuit 304, an output value is received from the multiplier 303 and calculates a weighted average of the output values from the past to the current, receiving the output value from the multiplier 303. The smoothing circuit 304 is a low-pass filter.

Next, a nature of the output value of the step size control circuit 51 will be discussed with reference to FIG. 4.

Figure 4:
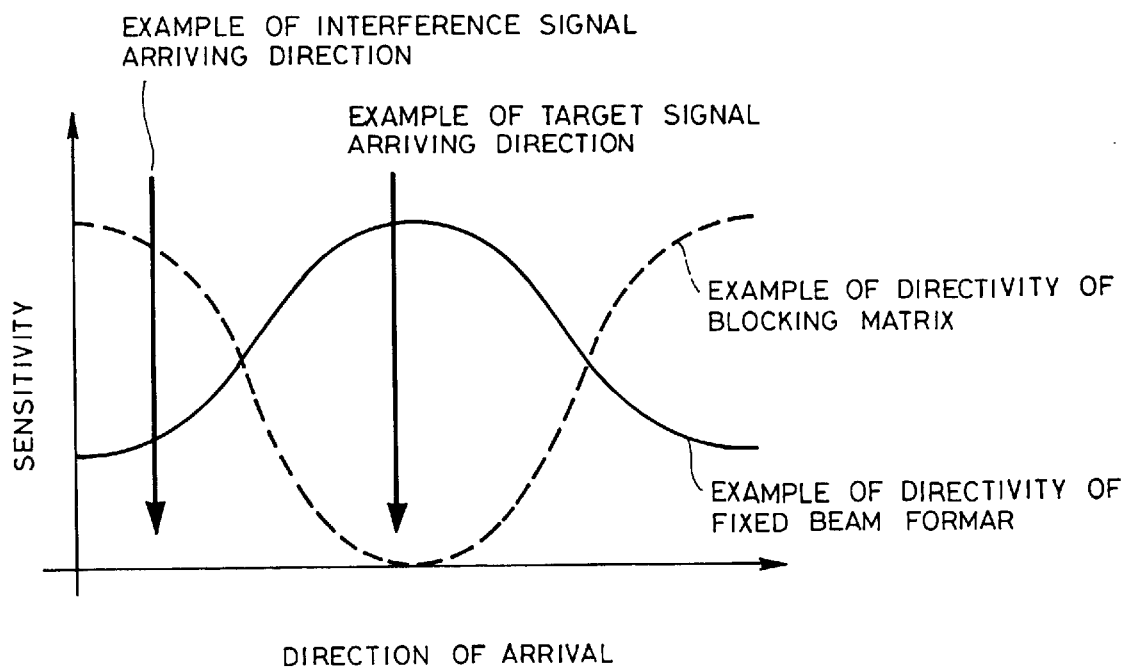
FIG. 4 is an illustration diagrammatically showing a directivity of an output of a fixed beam former 3 and an output of a blocking matrix 20.

FIG. 4 is an illustration diagrammatically showing a directivity of the output of the fixed beam former 3 and the output of the blocking matrix. In FIG. 4, a horizontal axis represents an arriving direction of the signal and a vertical axis represents a sensitivity. An arriving direction of the target signal is assumed to be present in the vicinity of center in the horizontal axis. As already shown, the output of the fixed beam former 3 has a high sensitivity in the vicinity of the arriving direction of the target signal and has low sensitivity in other directions. On the other hand, in the output of the blocking matrix 20, the target signal is attenuated. Namely, in the vicinity of the arriving direction of the target signal, the blocking matrix 20 has low sensitivity in the vicinity of arriving direction of the target signal and high sensitivity with respect to other directions.

Accordingly, when the target signal is sufficiently large and the interference signal is sufficiently small, the output of the fixed beam former 3 is large and the output of the blocking matrix 20 is small. In this case, in FIG. 2, the output of the amplitude indicative value calculating circuit 104 is greater than the output of the multiplier 107. Accordingly, to the output of the step size control circuit 51, zero is output. Conversely, when the target signal is sufficiently small and the interference signal is sufficiently large, the output of the fixed beam former 3 is small and the output of the blocking matrix 20 is large. In this case, in FIG. 2, the output of the amplitude indicative value calculating circuit 104 is smaller than the output of the multiplier 107. Thus, one is output at the output of the step size control circuit 51.

Thus, depending upon a ratio of the target signal and the interference signal (hereinafter referred to as "target/interference ratio), the output of the step size control circuit 51 is switched. When the output is switched, a threshold value of the target/interference ratio can be adjusted by the constant ν. When the constant ν is set to be greater, the threshold value of the target/interference ratio at time of switching of the output of the step size control circuit 51 becomes greater. Conversely, when the constant ν is set to be smaller, the threshold value of the target/interference ratio at a time of switching of the output becomes smaller.

Subsequently, an effect of controlling updating of the tap coefficients of respective adaptive filters in FIG. 1 depending upon the output value of the step size control circuit 51, will be discussed.

As already discussed, the adaptive filters 7m in FIG. 1 performs updating of the filter coefficients by the step size control coefficients output by the step size control circuit 51.

As discussed above, the output value of the step size control circuit 51 becomes zero when the target/interference ratio is large, and one when the target/interference ratio is small. Accordingly, only target signal is present and the interference signal is not present, updating of the filter coefficients is not performed. This means that disturbance of the filter coefficients of the adaptive filter by the target signal can be prevented. Accordingly, effect of reduction of degradation of the signal or breathing noise in the final output can be achieved.

Also, for the effect set forth above, even when the constant α determining the step size in the adaptive filter 7m is set large, degradation of the signal and the breathing noise becomes small in the final output. When the constant α is large, updating of the tap can be performed at high speed. Accordingly, since following speed with respect to movement of the interference signal source becomes high, the breathing noise due to movement of the interference signal source can be reduced.

Thus, by controlling the step size on the basis of the output of the step size control circuit 51 and setting the constant α for the step size large, degradation of the signal and breathing noise in the final output can be reduced. Thus, effect for reducing the breathing noise due to movement of the interference signal source can be achieved.

Figure 5:
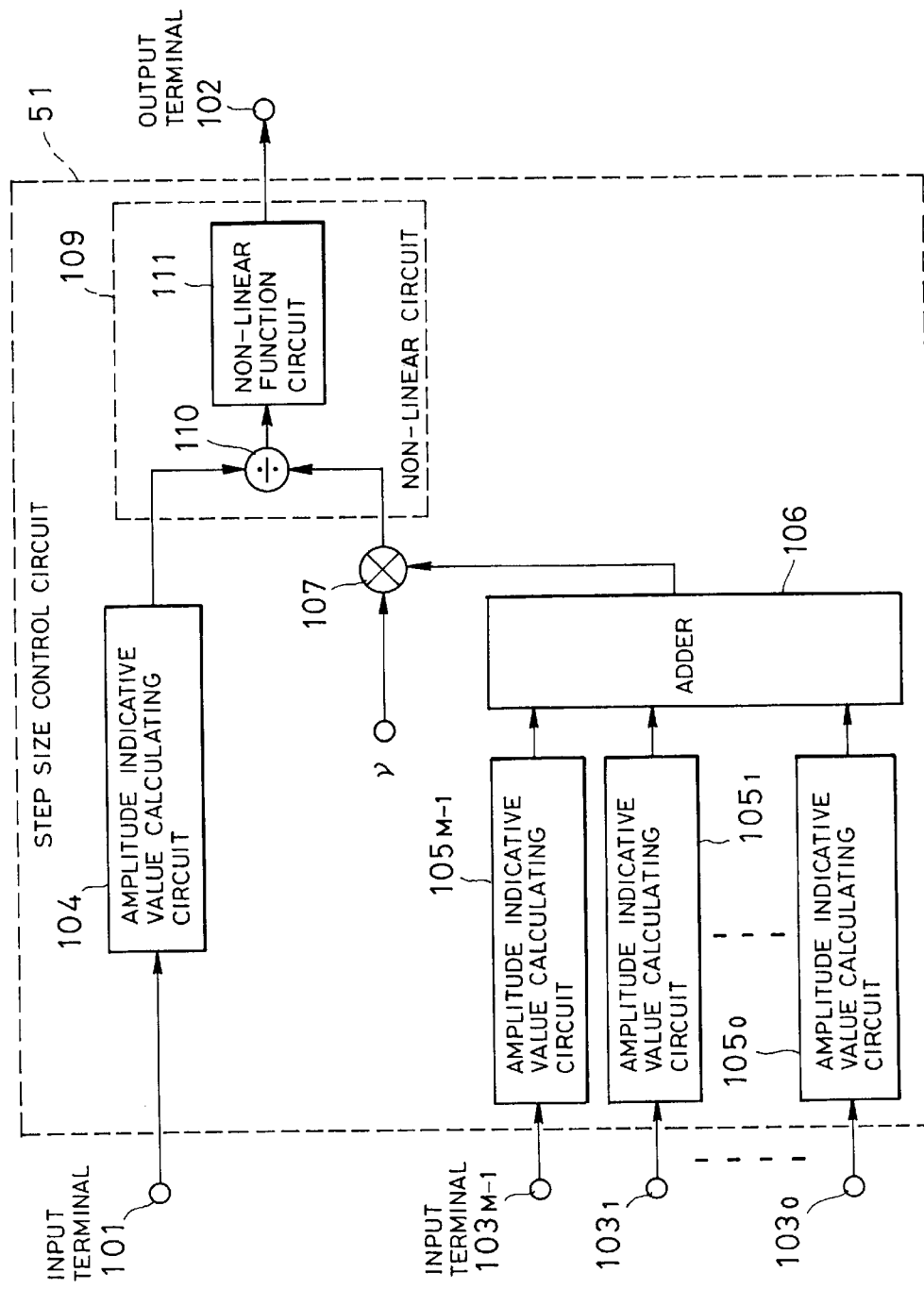
FIG. 5 is a block diagram shows another construction of a step size control circuit 51 of FIG. 1.

As a construction of the step size control circuit 51 in FIG. 1, a construction shown in FIG. 5 can be employed other than FIG. 2. Hereinafter, the operation of the step size control circuit 51 shown in FIG. 5 will be explained.

A difference between the construction of the step size control circuit 51 shown in FIG. 5 and the construction of the step size control circuit 51 shown in FIG. 2 is that the comparator 108 in FIG. 2 is replaced with a non-linear circuit 109 in FIG. 5. Hereinafter, only different component will be discussed in detail.

The non-linear circuit 109 receives the signal from the amplitude indicative value calculating circuit 104 and the signal from the multiplier 107 to transmit to a divider 110. The divider 110 divides the signal from the amplitude indicative value calculating circuit 104 by the signal received from the multiplier 107 to derive a quotient to transmit to a non-linear function circuit 111. In the non-linear function circuit 111, with respect to a value received from the divider 110, a value close to zero is output when the value received from the divider 110 is large, and a value close to one is output when the value received from the divider 110 is small. The output of the non-linear function circuit 111 becomes the output of the step size control circuit 51.

Figure 6:
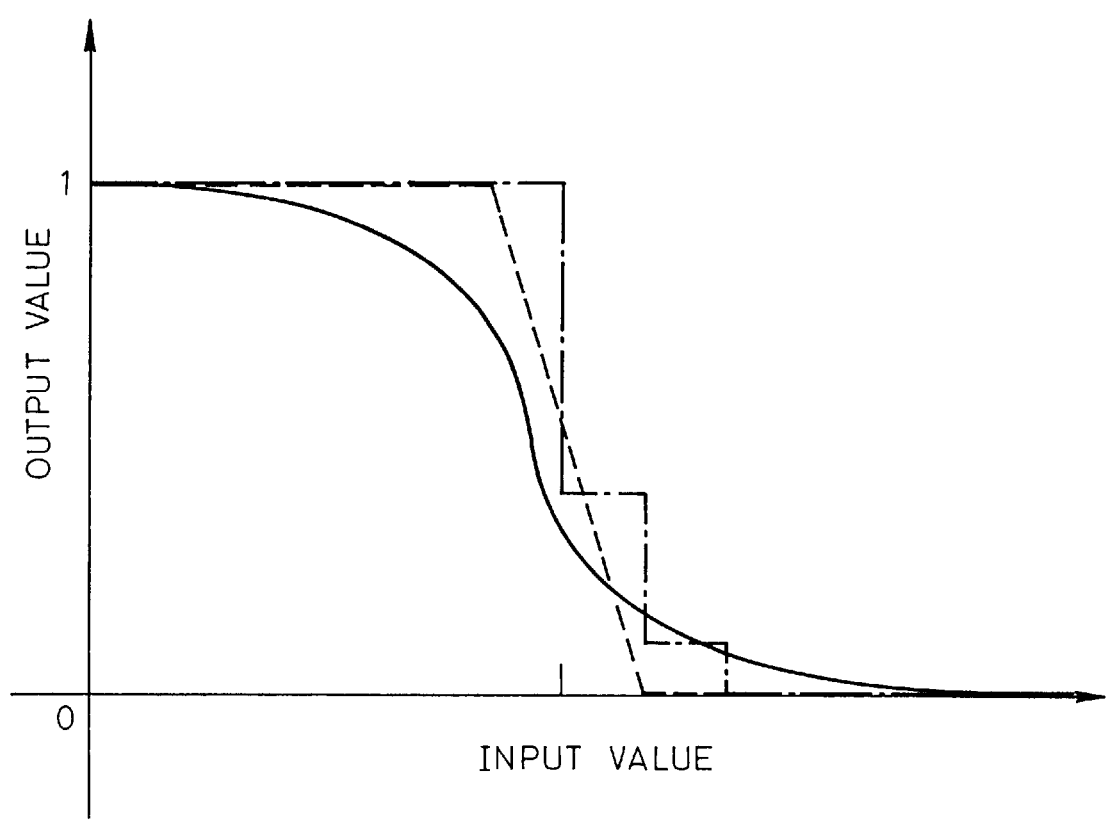
FIG. 6 is an illustration showing an example of a relationship of input and output of a non-linear function circuit 111 of FIG. 5.

FIG. 6 shows an example of a relationship between input and output of the non-linear function circuit 111 in FIG. 5. In FIG. 6, the horizontal axis represents an input value and a vertical axis represents an output value. As a non-linear function, various function, such as a diode function (broken line), a step function (one-dotted-line), a continuous smooth function (solid line) and so forth, may be employed as long as the function outputs a value close to zero is output when the input value is large and a positive value close to one when the input value is small. The function to be employed is not limited to the non-linear function but can be a linear function.

In the case either functions is employed, a positive value close to zero is output at the output of the step size control circuit 51 in FIG. 1 when the target signal is sufficiently large and the interference signal is sufficiently small. Therefore, updating of the tap coefficients of the adaptive filter in FIG. 1 barely performed. This means that disturbance of the tap coefficients of the adaptive filter by the target signal can be prevented. Accordingly, degradation of the signal and breathing noise in the final output can be reduced. Thus, when either a construction shown in FIG. 5 or a construction shown in FIG. 2 is employed as a replacement of the step size control circuit in FIG. 1, similar effect can be achieved. Furthermore, since a period where the output of the step size control circuit is not zero, namely a period where updating of the tap coefficients is performed, is increased, an effect to make convergence speed of the adaptive filter becomes faster.

In FIG. 5, the non-linear circuit 109 can take a construction other than the construction shown in FIG. 5. For example, the non-linear circuit 109 may be constructed with a table reference circuit having two inputs.

Second Embodiment

Figure 7:
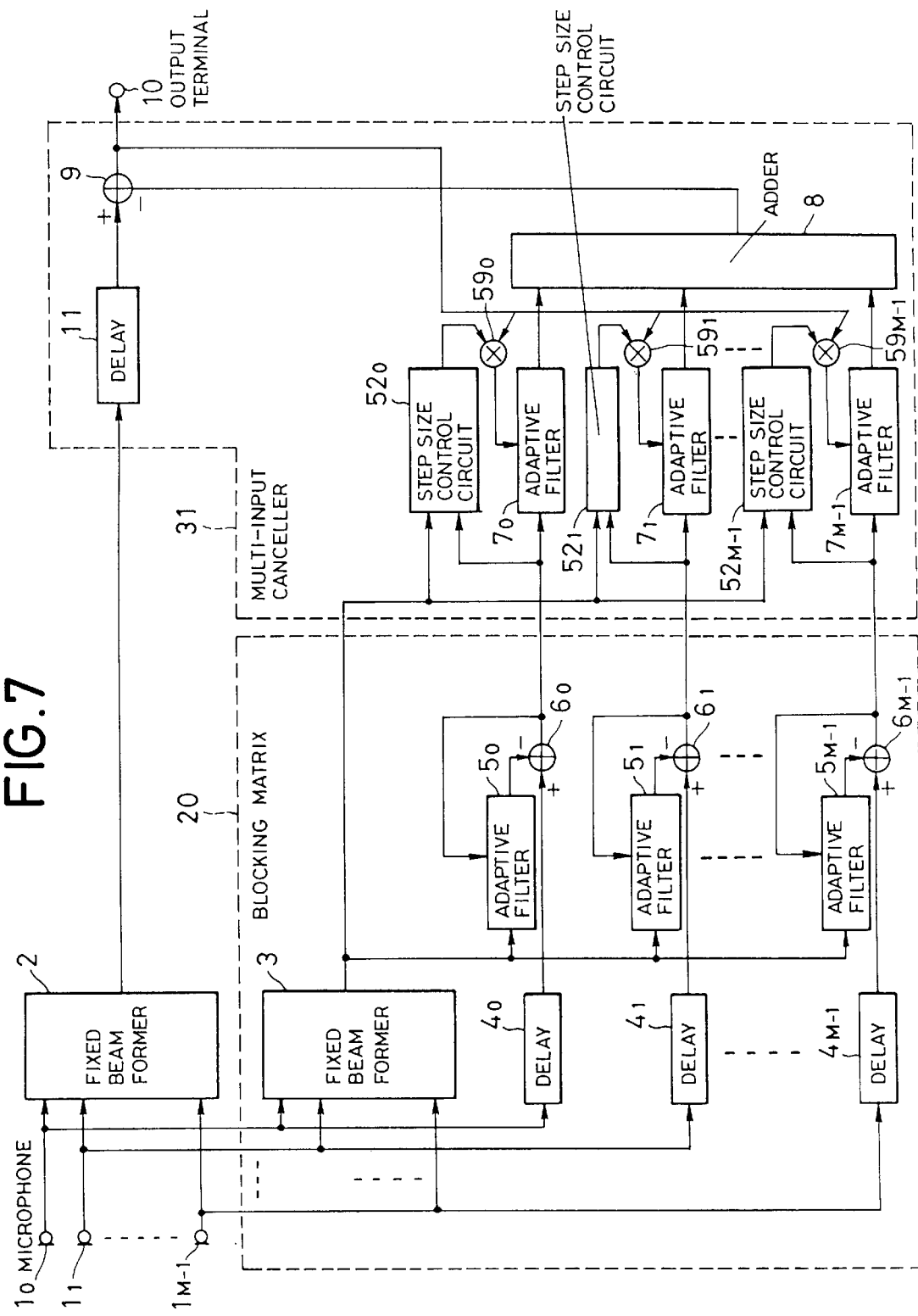
FIG. 7 is a block diagram showing a construction of the second embodiment of an adaptive array apparatus according to the present invention.

FIG. 7 is a block diagram showing the second embodiment of the adaptive array apparatus according to the present invention.

Figure 35:
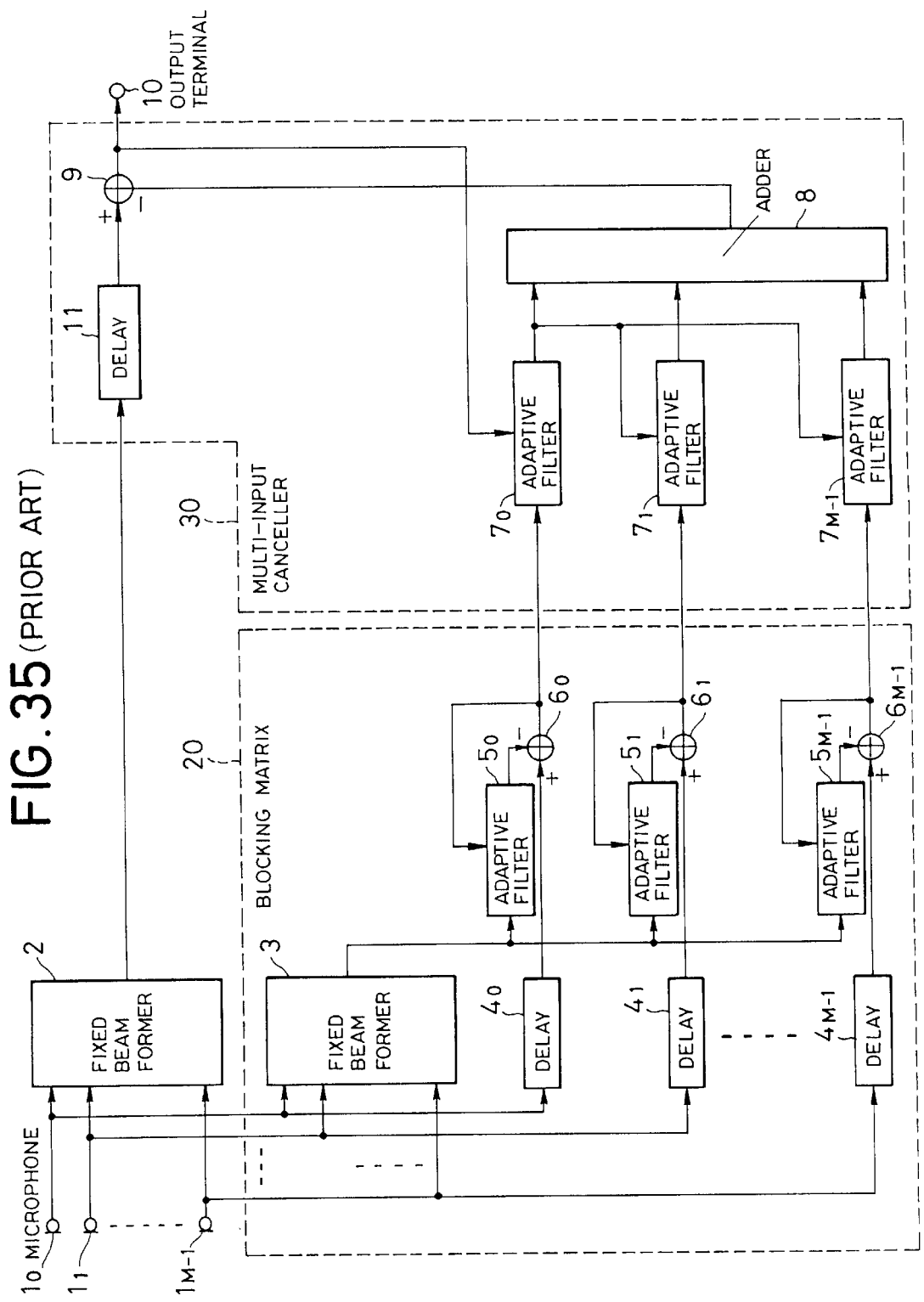
FIG. 35 is a block diagram showing a construction of the conventional adaptive array apparatus.

The shown embodiment is constructed by providing step size control circuit group 52m (m=0, 1, ..., M−1), and multiplier group 59m (m=0, 1, ..., M−1) are inserted in a path from the subtractor 9 to respective adaptive filter 7m for the construction of the conventional adaptive array apparatus shown in FIG. 35. Hereinafter, operation and effect of the step size control circuit group 52m and the multiplier group 59m will be discussed.

Each step size control circuit 52m receives the output signal of the fixed beam former 3 to calculate the amplitude indicative value thereof, and receives the output of the corresponding subtractor 6m to calculate the amplitude indicative value thereof. By comparing two amplitude indicative values, each step size control circuit 52m calculates and outputs the step size control coefficients to transmit to the corresponding multiplier 59. Each multiplier 59m multiplies the signal received from the subtractor 9 with the step size control coefficients received from the corresponding step size control circuit 52m to transmit to the corresponding adaptive filter 7m.

Figure 8:
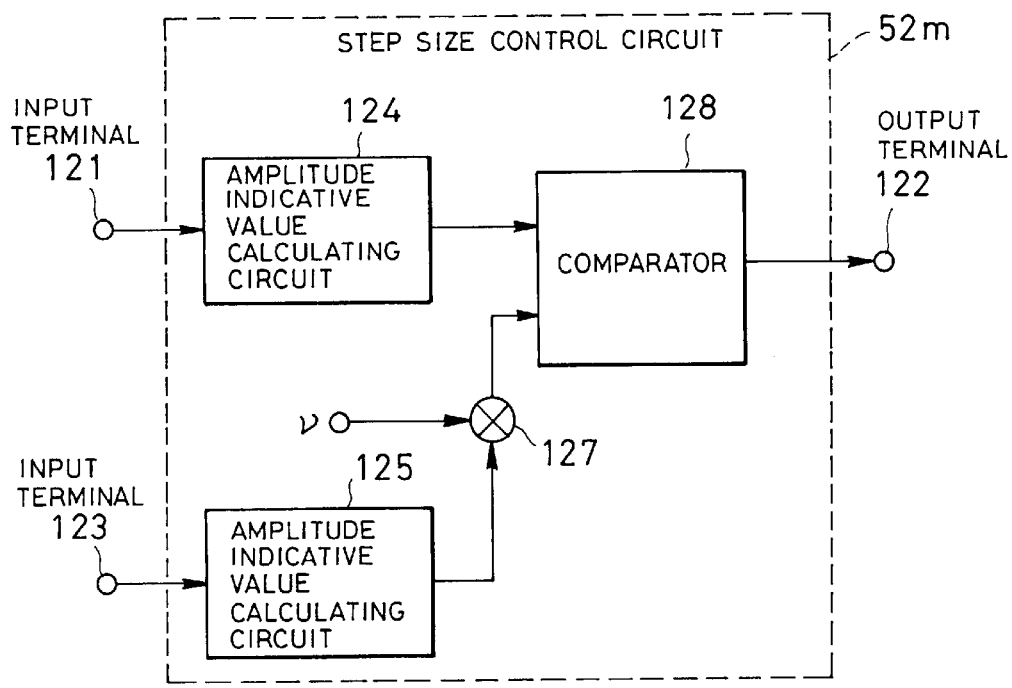
FIG. 8 is a block diagram showing a construction of a step size control circuit 52*m* of FIG. 7.

FIG. 8 shows one example of a construction of the step size control circuit 52m in this embodiment.

Hereinafter, the operation of the step size control circuit 52m will be discussed with reference to FIG. 8.

The output signal of the fixed beam former 3 in FIG. 7 is transmitted to an amplitude indicative value calculating circuit 124 through an input terminal 121. The amplitude indicative value calculating circuit 124 calculates an amplitude indicative value of the signal received from the input terminal 121 to transmit a result of calculation to a comparator 128. On the other hand, a group of output signals of the blocking matrix 20 in FIG. 7 are respectively transmitted to amplitude indicative value calculating circuits 125 through respectively corresponding input terminals 123. Respective amplitude indicative value calculating circuits 125 calculate amplitude indicative values of the signals received from the input terminal 123 to transmit the results of calculation to a multiplier 127. The multiplier 127 multiplies a constant ν with the signal received from the amplitude indicative value calculating circuit 125 to transmit the result of calculation to the comparator 128. In the comparator 128, the value received from the amplitude indicative value calculating circuit 124 and a value received from the multiplier 127 are compared to output zero to an output terminal 122 when the value received from the amplitude indicative value calculating circuit 124 is greater than the value received from the amplitude indicative value calculating circuit 125 and to output one to the output terminal 122 otherwise. An output of the comparator 128 becomes an output of the step size control circuit. As a construction of the amplitude indicative value calculating circuits 124 and 125, a construction shown in FIG. 3 used in the discussion of the first embodiment, for example, can be employed.

Next, a nature of the output value of the step size control circuit 52m will be discussed.

As discussed in the first embodiment with reference to FIG. 4, the fixed beam former 3 has high sensitivity in the vicinity of the arriving direction of the target signal and has low sensitivity in other directions. On the other hand, the output of respective subtractors 6m can be considered as beam former having low sensitivity in the vicinity of the arriving direction of the target signal and high sensitivity in other directions.

Accordingly, when the target signal is sufficiently large and the interference signal is sufficiently small, the output signal amplitude of the fixed beam former 3 is greater than the output signal amplitude of the subtractor 6m. In this case, zero is output to the output terminal 122 of each step size control circuit 52m. Conversely, when the target signal is sufficiently small and the interference signal is sufficiently large, the output signal amplitude of the subtractor 6m is greater than the output signal amplitude of the fixed beam former 3. In this case, one is output to the output terminal 122 of each step size control circuit 52m.

The nature of the output of the step size control circuit 52m is the same as the nature of the first embodiment of the step size control circuit 51. In the shown embodiment, the step size of each adaptive filter 7m in the multi-input canceller 32 becomes a value proportional to the output value of the corresponding to step size control circuit 52m. Accordingly, even in the shown embodiment, similarly to the first embodiment, degradation of the signal and breathing noise in the final output can be reduced to achieve an effect to reduce the breathing noise.

Figure 9:
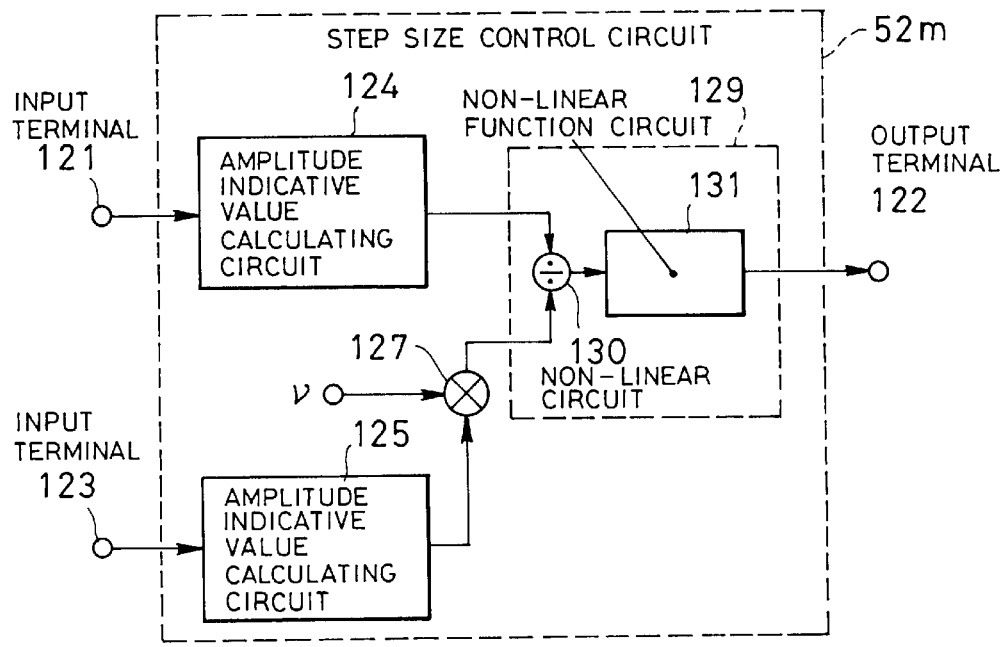
FIG. 9 is a block diagram showing another construction of the step size control circuit 52*m* of FIG. 7.

As a construction of the step size control circuit 52m in FIG. 7, a construction shown in FIG. 9 can be employed other than that shown in FIG. 8. Hereinafter, operation of the step size control circuit 52m constructed as shown in FIG. 9 will be discussed.

A construction of the step size control circuit 52m and the construction of the step size control circuit 52m shown in FIG. 8 are differentiated only in that the comparator 128 in FIG. 8 is replaced with a non-linear circuit 129 in FIG. 9. This difference is similar to the difference of the construction of FIG. 2 and the construction of FIG. 5 as discussed with respect to the construction of the step size control circuit 51 in the first embodiment, to achieve the same effect. Accordingly, even in the case where the construction shown in FIG. 9 is employed as the step size control circuit 52m, similar effect as those achieved by the construction shown in FIG. 8, can be achieved.

Third Embodiment

Figure 10:
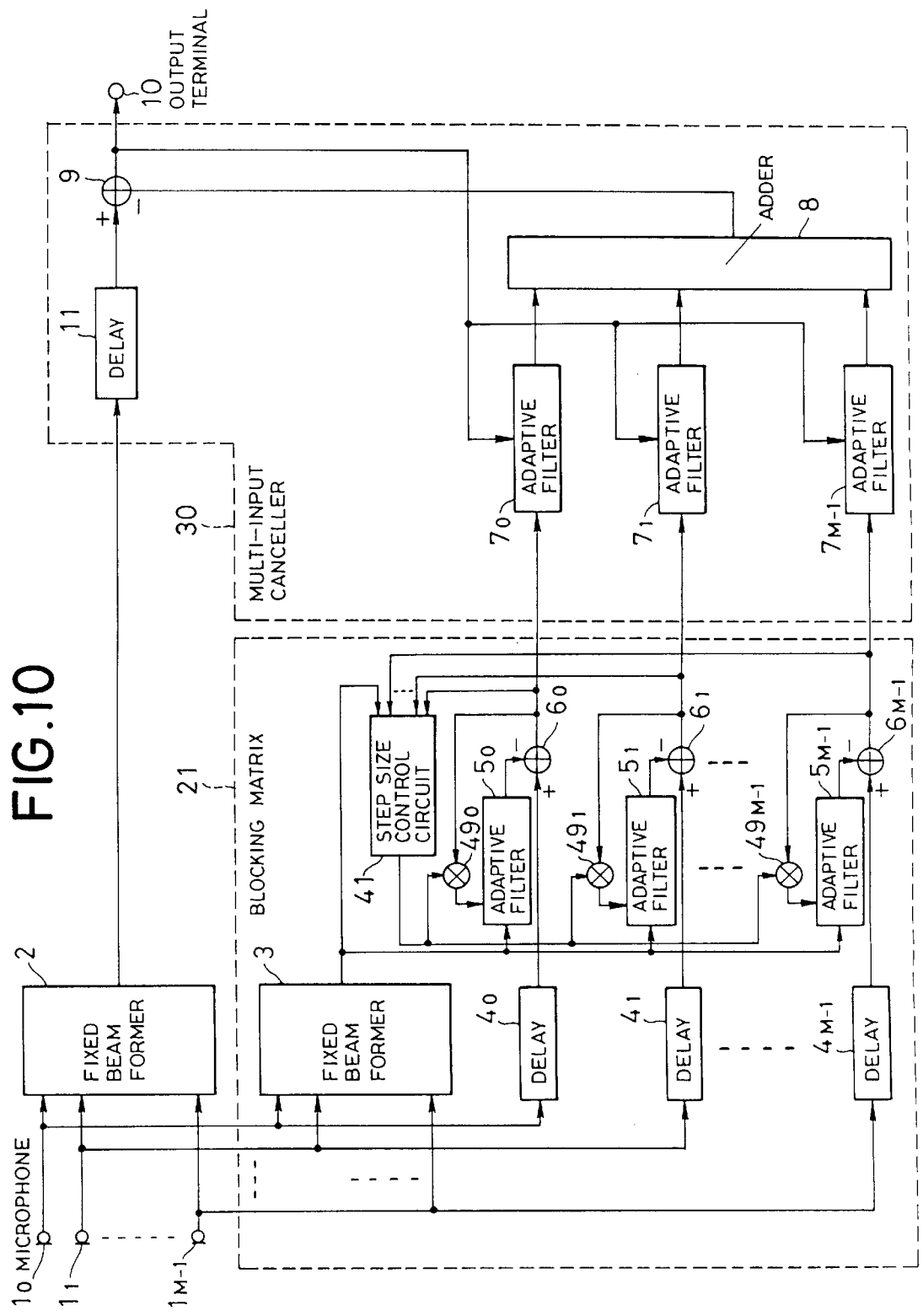
FIG. 10 is a block diagram showing a construction of the third embodiment of an adaptive array apparatus according to the present invention.

FIG. 10 is a block diagram of the third embodiment of the adaptive array apparatus according to the present invention.

Figure 33:
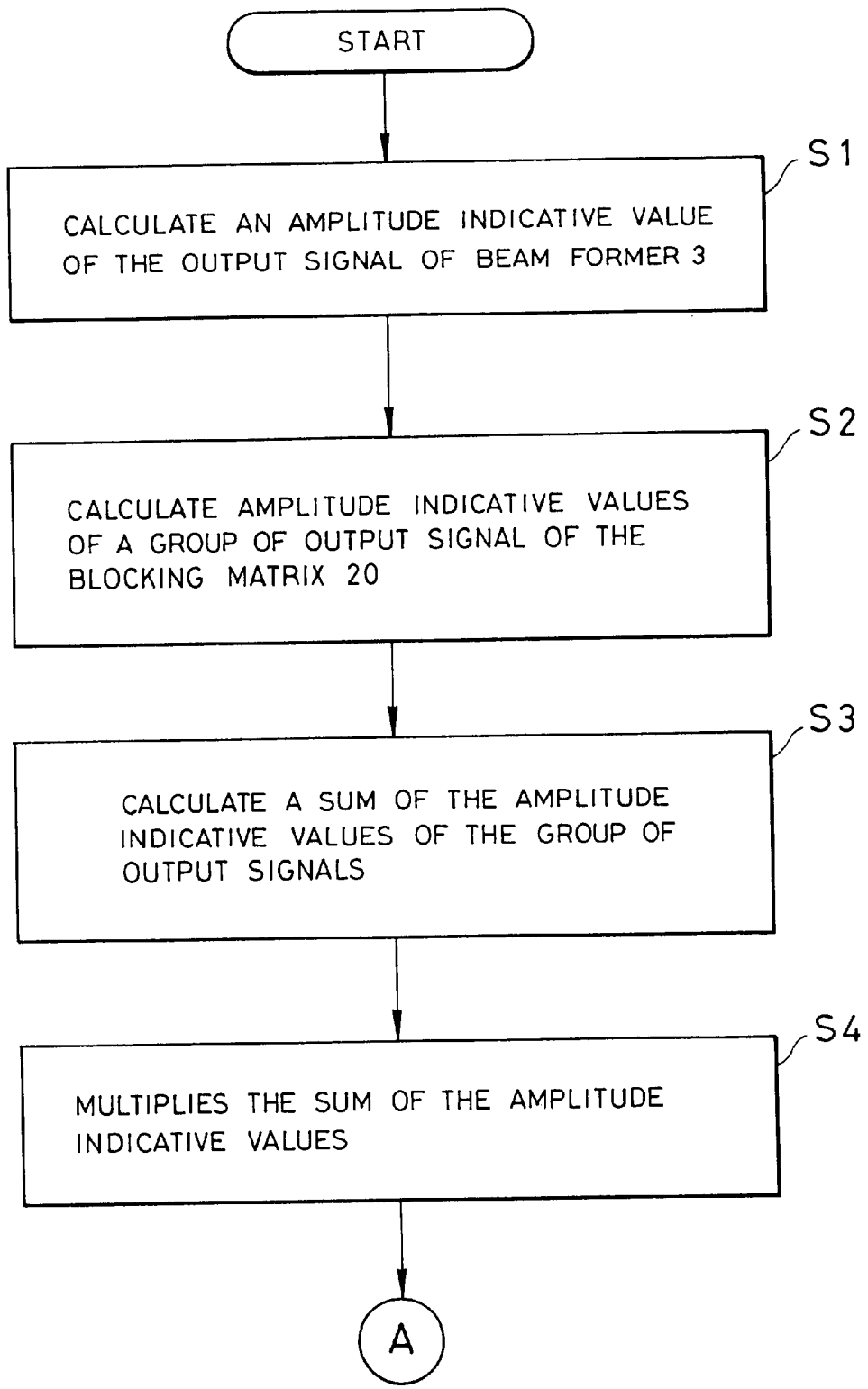
FIG. 33 is a flowchart showing the operation of the step size control circuit 51.
Figure 34:
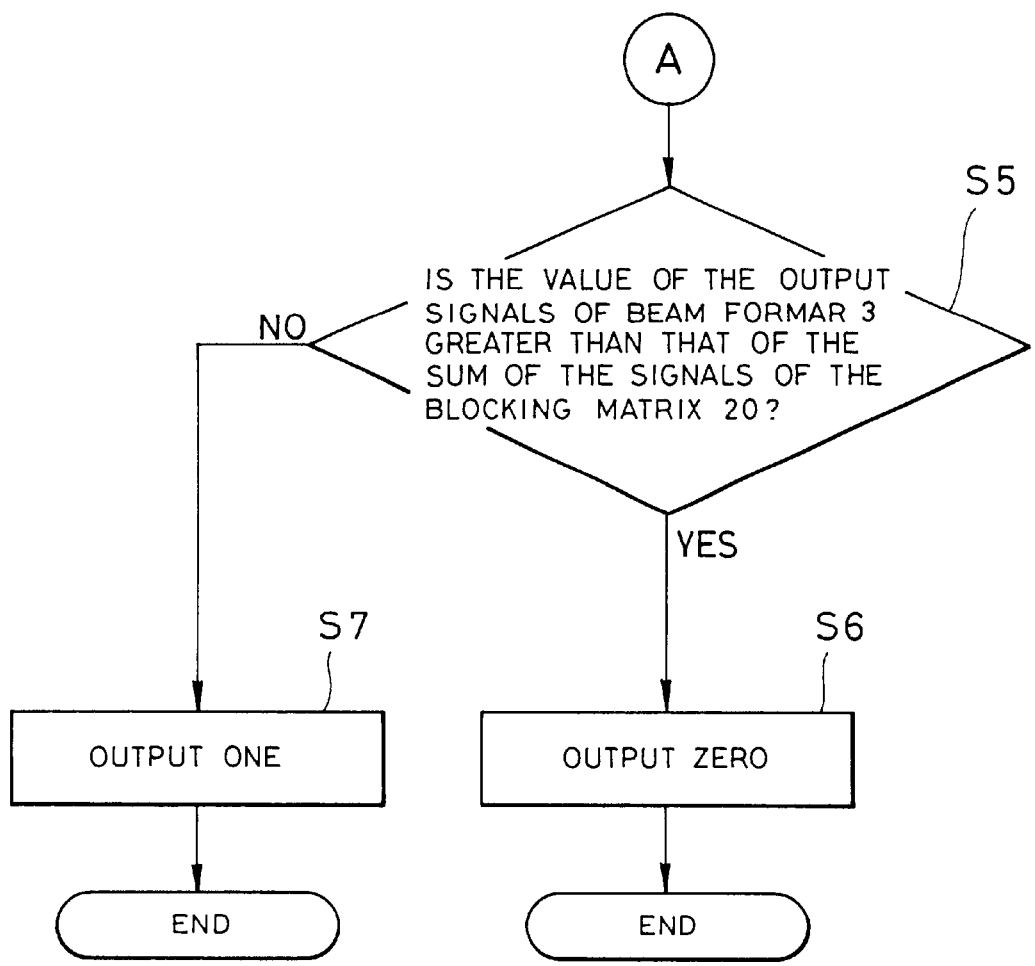
FIG. 34 is a flowchart showing the operation of the step size control circuit 51.

The shown embodiment is constructed by replacing the blocking matrix 20 with a blocking matrix 21, for the conventional adaptive array apparatus shown in FIG. 33. Therefore, in the following disclosure, only different portion will be discussed.

A difference between the blocking matrix 20 and the blocking matrix 21 resides in addition of the step size control circuit 41 and in insertion of multipliers 49m in paths from respective subtractors 6m to corresponding adaptive filter 5m. Hereinafter, operation and effect of the step size control circuit 41 and the multipliers 49m will be discussed.

The step size control circuit 41 receives the output signal of the fixed beam former 3 to calculate the amplitude indicative value and receives the output signal group of the blocking matrix 21 to calculate the amplitude indicative values thereof. By comparing these amplitude indicative values, the step size control coefficients is calculated and output to transmit to respective multipliers 49m. In each multiplier 49m, the step size control coefficients received from the step size control circuit 41 is multiplied with the signal received from the corresponding subtractor 6m to transmit to the corresponding adaptive filter 5m. The signal transmitted from each subtractor 6m to the adaptive filter 5m is used for updating the tap coefficients of the adaptive filter 5m. Accordingly, updating of the tap coefficients of the adaptive filter 5m can be controlled by the step size control circuit 41.

Figure 11:
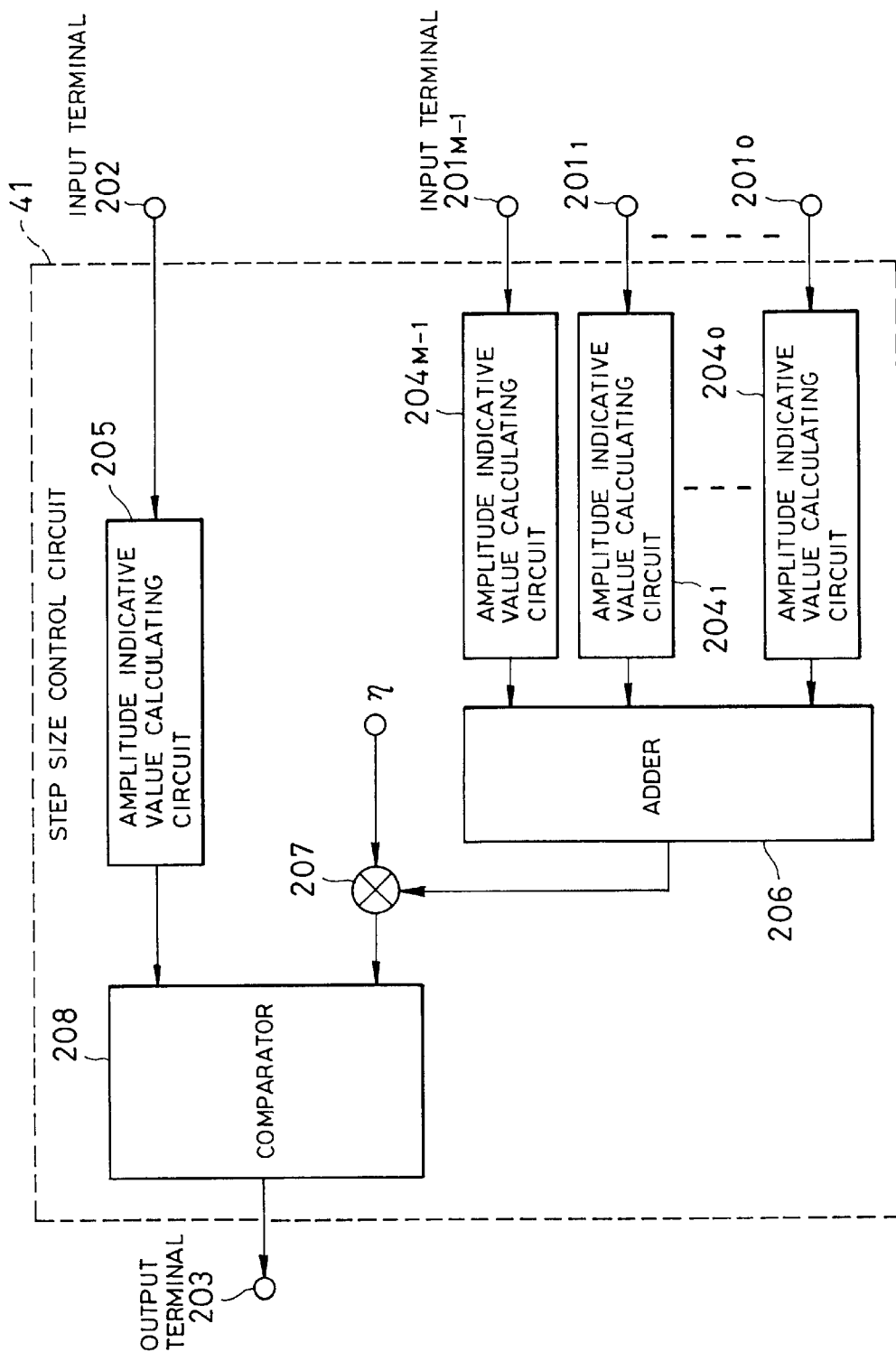
FIG. 11 is a block diagram showing a construction of a step size control circuit 41 of FIG. 10.

FIG. 11 shows one example of the construction of the step size control circuit 41 in the shown embodiment. Hereinafter, the operation of the step size control circuit 41 will be discussed with reference to FIG. 11.

The output signal of the fixed beam former 3 in FIG. 10 is transmitted to the amplitude indicative value calculating circuit 205 through the input terminal 202. The amplitude indicative value calculating circuit 205 calculates the amplitude indicative value of the signal received from the input terminal 202 to transmit the result of calculation to a comparator 208. On the other hand, the output signal of respective subtractor 6m in FIG. 10 is transmitted to corresponding power indicative value calculating circuits 204m through input terminals 201m. Each amplitude indicative value calculating circuit 204m calculates the amplitude indicative value of the signal received from the corresponding input terminal 201m to transmit the result of calculation to the adder 206. The adder 206 calculates a sum of the signals received from the amplitude indicative value calculating circuits 204m to transmit the result of calculation to a multiplier 207. The multiplier 207 multiplies a constant η with the signal received from the adder 206 to transmit the result of calculation to the comparator 208. In the comparator 208, the value received from the amplitude indicative value calculating circuit 205 and the value received from the multiplier 207 are compared to output one when the value received from the amplitude indicative value calculating circuit 205 is greater than the value received from the multiplier 207, and zero otherwise. The output of the comparator 208 becomes the output of the step size control circuit 41.

Next, the nature of the output value of the step size control circuit 41 will be discussed.

As discussed in the first embodiment with reference to FIG. 4, the fixed beam former 3 has high sensitivity in the vicinity of the arriving direction of the target signal and low sensitivity in other directions. On the other hand, the output of the blocking matrix 21 can be considered as the output of the beam former having low sensitivity in the vicinity of the arriving direction of the target signal and high sensitivity in other directions.

Accordingly, when the target signal is sufficiently large and the interference signal is sufficiently small, the output amplitude of the fixed beam former 3 is larger than the output amplitude of the blocking matrix 21. In this case, one is output at the output of the step size control circuit. Conversely, when the target signal is sufficiently small and the interference signal is sufficiently large, the output amplitude of the fixed beam former 3 is larger than the output amplitude of the blocking matrix 21. In this case, zero is output at the output of the step size control circuit 41.

As set forth above, by the target/interference ratio, the output of the step size control circuit 41 is switched. A threshold value of the target/interference ratio can be adjusted by the constant η. When the constant η is made large, the threshold value of the target/interference ratio upon switching of the output becomes large. Conversely, when the constant η becomes small, the threshold value of the target/interference ratio upon switching output becomes small.

Subsequently, an effect of control of updating of the tap coefficients of the adaptive filter group 5m in FIG. 10 by the output value of the step size control circuit 41, will be discussed.

As set forth above, the output value of the step size control circuit 41 becomes one when the target/interference ratio is large, and zero when the target/interference ratio is small. Accordingly, when the target signal is not present and only interference signal is present, updating of the filter coefficients is not performed. This means that disturbance of the filter coefficients of the adaptive filter by the interference signal can be prevented. Accordingly, the effect of reduction of breathing noise of the signal in the final output can be achieved.

Also, for the effect set forth above, even when the constant β determining the step size of updating of the coefficients is set large, and the breathing noise does not become large in the final output. When the constant β is large, updating of the tap coefficients can be performed at high speed. Accordingly, since following speed with respect to movement of the interference signal source becomes high, the breathing noise due to movement of the interference signal source can be reduced.

Thus, on the basis of the output of the step size control circuit 41, updating of the tap coefficients is controlled. By setting a constant β large, breathing noise in the final output can be reduced, and the breathing noise due to movement of the target signal source can be reduced.

Figure 12:
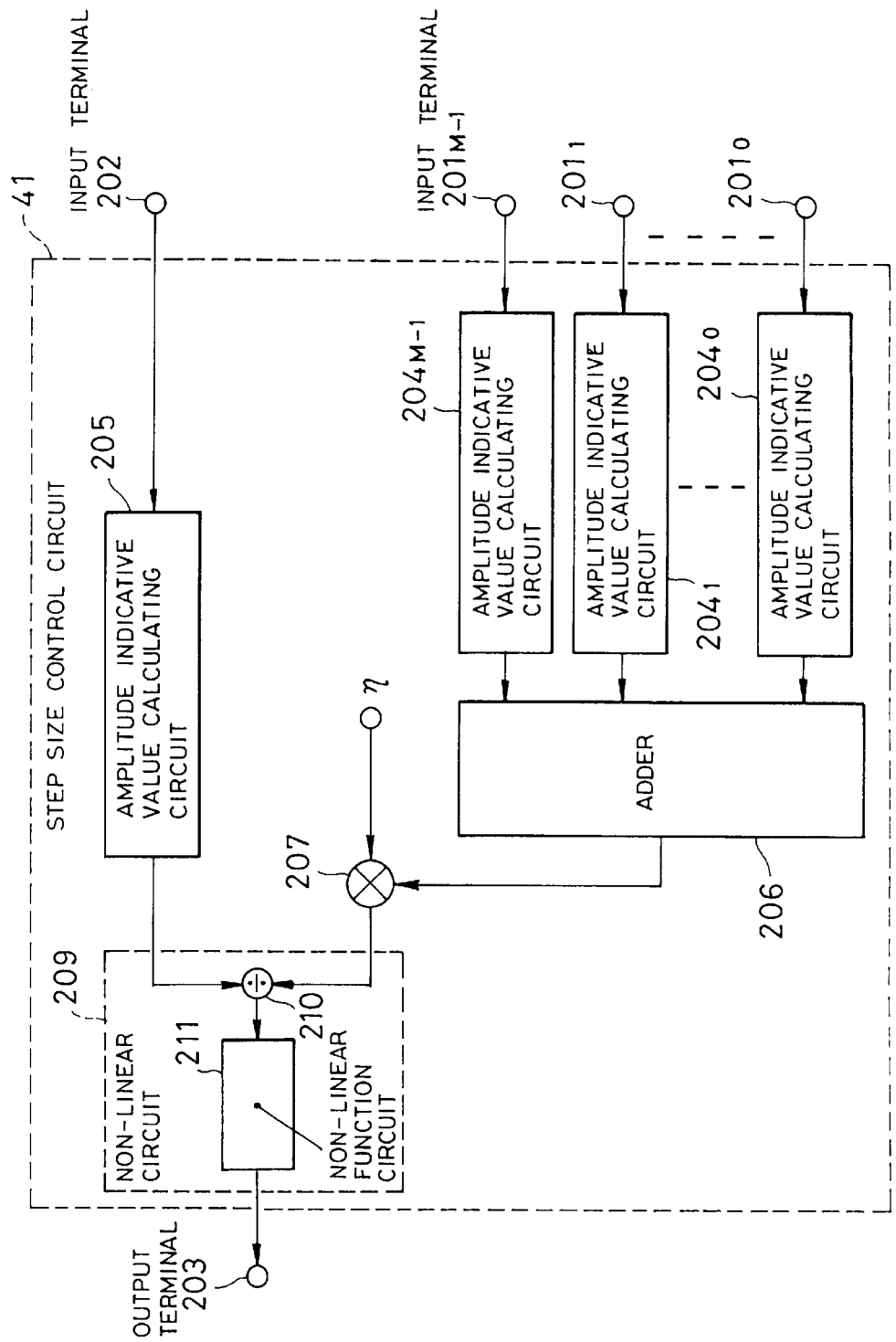
FIG. 12 is a block diagram showing another construction of a step size control circuit 41 of FIG. 10.

As a construction of the step size control circuit 41 in FIG. 10, a construction shown in FIG. 12 can be employed other than that shown in FIG. 11. An operation of the construction shown in FIG. 12 will be discussed hereinafter.

A difference between the construction of the step size control circuit shown in FIG. 12 and the construction of the step size control circuit shown in FIG. 11 is that the comparator 208 in FIG. 11 is replaced with the non-linear circuit 209 of FIG. 12. Hereinafter, only different construction will be discussed.

In the non-linear circuit 209, the signal received from the amplitude indicative value calculating circuit 205 and the signal received from the multiplier 207 are transmitted to the divider 210. In the divider 210, the signal received from the amplitude indicative value calculating circuit 205 is divided by the signal received from the multiplier 207 to transmit the quotient to a non-linear function circuit 211. In the non-linear function circuit 211, when the received value is greater than the value received from the divider 211, a value close to one is output, and when the received value is smaller than the value received from the divider 211, a non-negative value close to zero is output. The output of the non-linear function circuit 211 becomes output of the step size control circuit 41.

Figure 13:
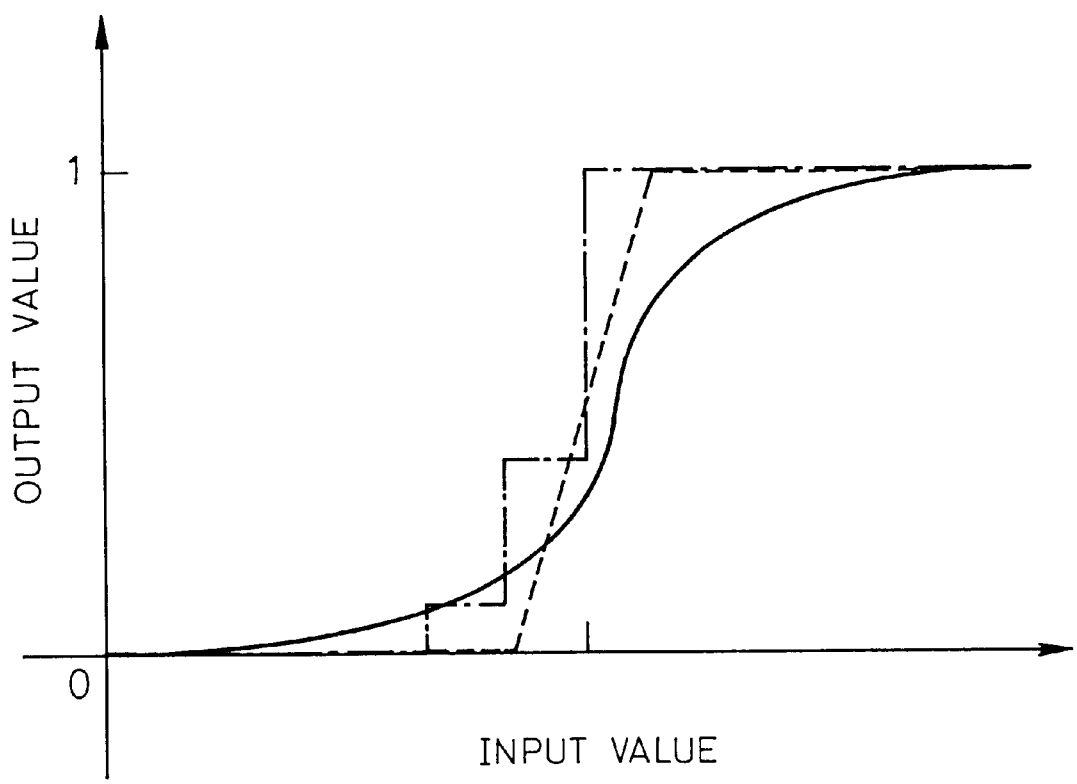
FIG. 13 is an illustration showing an example of a relationship of input and output of a non-linear function circuit 211 of FIG. 12.

FIG. 13 shows an example of a relationship between input and output of the non-linear function circuit 211. In FIG. 13, a horizontal axis represents an input value and a vertical axis represents an output value. The function of FIG. 13 is a function substantially symmetric to the function of FIG. 6. As a non-linear function, various function, such as a diode function (broken line), a step function (one-dotted-line), a continuous smooth function (solid line) and so forth, may be employed as long as the function outputs a value close to one is output when the received value is large and a non-negative value close to zero when the received value is small. The function to be employed is not limited to the non-linear function but can be a linear function.

In the case either functions is employed, a positive value close to zero is output at the output of the step size control circuit 41 when only the interference signal is present and the target signal is not present. Therefore, updating of the tap coefficients of the adaptive filter 5m in FIG. 10 is barely performed. This means that disturbance of the tap coefficients of the adaptive filter 5m by the interference signal can be prevented. Accordingly, degradation of the signal and breathing noise in the final output can be reduced. Thus, when the construction shown in FIG. 12 is employed as the step size control circuit 41 in FIG. 10, the similar effect to the case employing construction shown in FIG. 11 can be achieved. A period where the output of the step size control circuit 41 is not zero, namely the period where the tap coefficients is updated, is increased to achieve effect to accelerate convergence speed of the adaptive filter.

The non-linear circuit 209 in FIG. 12 can take a construction other than the construction shown in FIG. 12. For example, a table reference circuit having two inputs can be employed.

Figure 14:
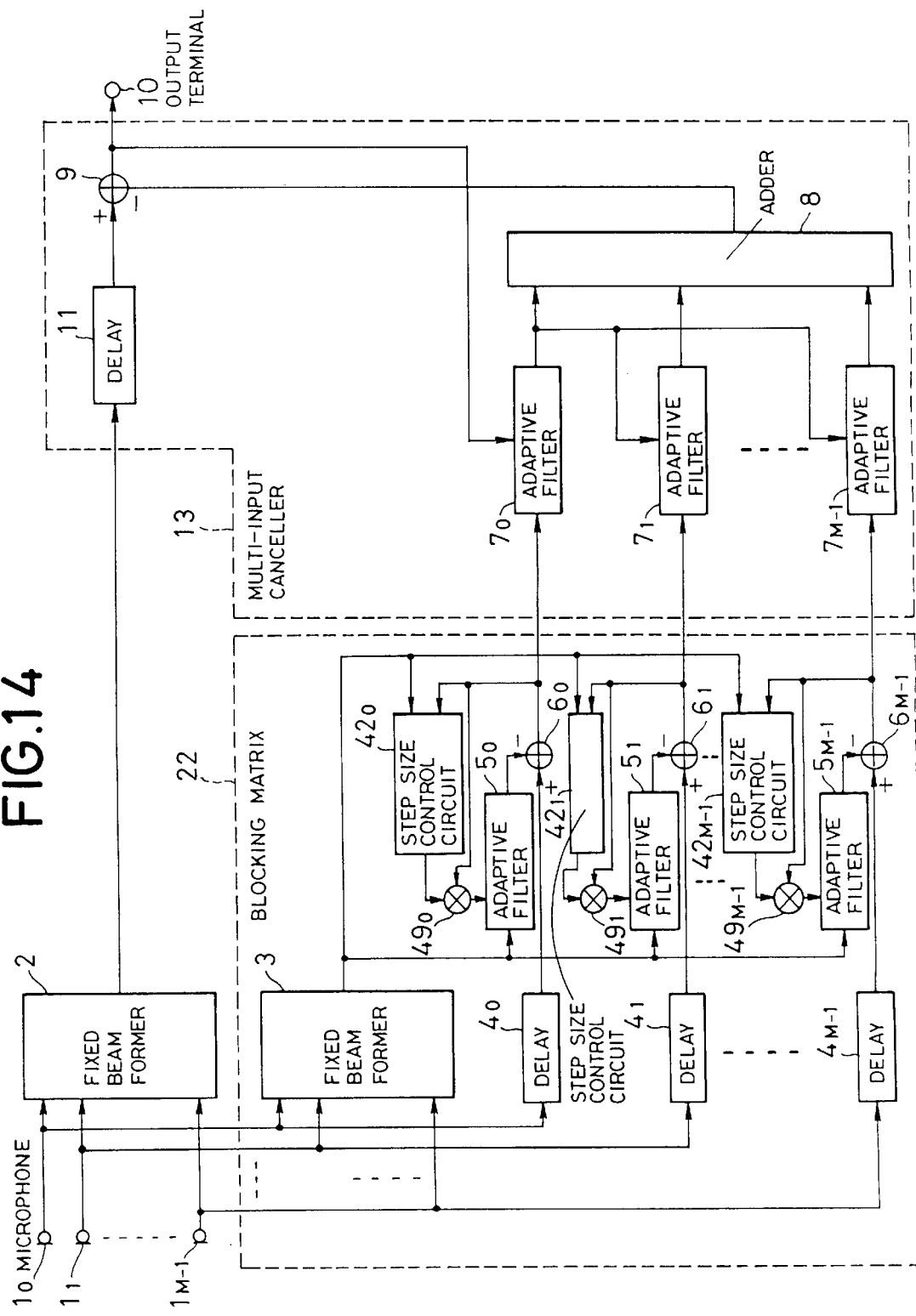
FIG. 14 is a block diagram showing a construction of the fourth embodiment of an adaptive array apparatus according to the present invention.

FIG. 14 is a block diagram of the fourth embodiment of the adaptive array apparatus according to the present invention.

The shown embodiment is constructed by replacing the blocking matrix 20 with a blocking matrix 22 in FIG. 14, for the conventional adaptive array apparatus shown in FIG. 33. Therefore, in the following disclosure, only different portion will be discussed.

A difference between the blocking matrix 20 in FIG. 33 and the blocking matrix 22 in FIG. 14 resides in addition of the step size control circuits 42m and in insertion of multipliers 49m in paths from respective subtractors 6m to corresponding adaptive filter 5m. Hereinafter, operation and effect of the step size control circuits 42m and the multipliers 49m will be discussed.

Each step size control circuit 42m receives the output signal of the fixed beam former 3 to calculate the amplitude indicative value and receives the output signal of the corresponding subtractor 6m to calculate the amplitude indicative values thereof. By comparing these amplitude indicative values, the step size control coefficients is calculated and output to transmit to respective multipliers 49m. In each multiplier 49m, the step size control coefficients received from the step size control circuit 42m is multiplied with an error signal received from the corresponding subtractor 6m to transmit the product to the corresponding adaptive filter 5m. Namely, a value derived by multiplying the step size control coefficients with the constant β determining the step size becomes the step size.

Figure 15:
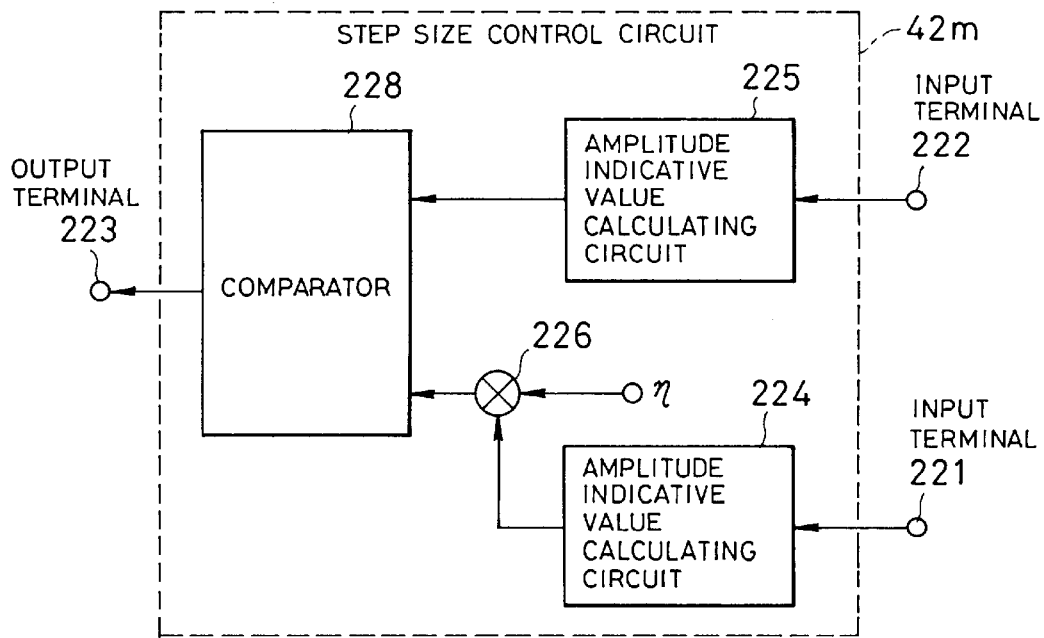
FIG. 15 is a block diagram showing a construction of a step size control circuit 42 of FIG. 14.

FIG. 15 shows one example of the construction of the step size control circuit 42m in the shown embodiment. Hereinafter, the operation of the step size control circuit 42m will be discussed with reference to FIG. 15.

The output signal of the fixed beam former 3 in FIG. 14 is transmitted to the amplitude indicative value calculating circuit 225 through the input terminal 222. The amplitude indicative value calculating circuit 225 calculates the amplitude indicative value of the signal received from the input terminal 222 to transmit the result of calculation to a comparator 228. On the other hand, the output signal of respective subtractor 6m in FIG. 14 is transmitted to corresponding power indicative value calculating circuits 224 through input terminals 221. Each amplitude indicative value calculating circuit 224 receives the output signal of the corresponding subtractor 6m and calculates the amplitude indicative value of the signal to transmit the result of calculation to a multiplier 226. The multiplier 226 multiplies a constant η with the signal received from the step size control circuit 224 to transmit the result of calculation to the comparator 228. In the comparator 228, the value received from the amplitude indicative value calculating circuit 225 and the value received from the multiplier 226 are compared to output one to an output terminal 223 when the value received from the amplitude indicative value calculating circuit 225 is greater than the value received from the multiplier 226, and zero to the output terminal 223 otherwise. The output of the comparator 228 is output to the step size control circuit 42m.

Next, the nature of the output value of the step size control circuit 42m will be discussed.

As discussed in the first embodiment with reference to FIG. 4, the output of the fixed beam former 3 has high sensitivity in the vicinity of the arriving direction of the target signal and low sensitivity in other directions. On the other hand, the output of each subtractor 6m can be considered as the output of the beam former having low sensitivity in the vicinity of the arriving direction of the target signal and high sensitivity in other directions.

Accordingly, when the target signal is sufficiently large and the interference signal is sufficiently small, the output amplitude of the fixed beam former 3 is large and the output amplitude of the subtractor 6m is small. In this case, in FIG. 15, the output of the amplitude indicative value calculating circuit 225 is larger than the output of the multiplier 226. Accordingly, one is output at the output terminal 223 of the step size control circuit 42m. Conversely, when the target signal is sufficiently small and the interference signal is sufficiently large, zero is output at the output terminal 223 of the step size control circuit 42m.

The nature of the output of the step size control circuit 42m is the same as the nature of the step size control circuit 41 in the third embodiment. In the fourth embodiment, similarly to the third embodiment, amount of updating of the tap coefficients of each adaptive filter 5m is proportional to the output value of the corresponding step size control circuit 42m. Accordingly, in the shown embodiment, similarly to the third embodiment, the breathing noise in the final output can be reduced and breathing noise due to movement of the target signal source can be reduced.

Figure 16:
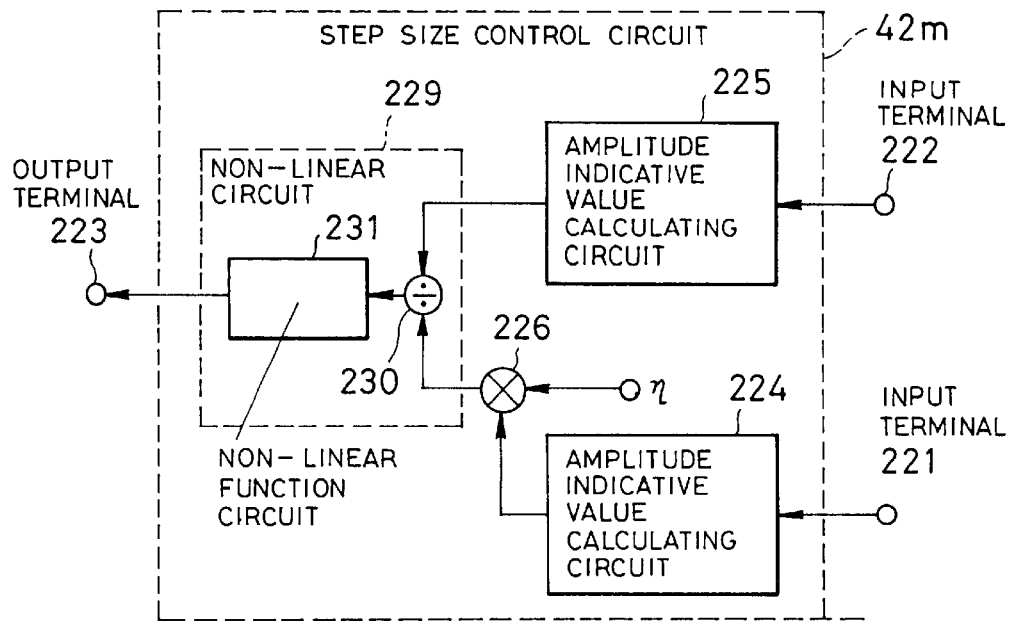
FIG. 16 is a block diagram showing another construction of a step size control circuit 42 of FIG. 14.

As a construction of the step size control circuit 42m in FIG. 14, a construction shown in FIG. 16 can be employed other than the construction shown in FIG. 15. The operation of the step size control circuit 42m of the construction shown in FIG. 16 will be discussed hereinafter.

A difference of the construction of the step size control circuit shown in FIG. 16 and the construction of the step size control circuit shown in FIG. 15 is that the comparator 228 in FIG. 15 is replaced with a non-linear circuit 229 in FIG. 16. This difference is the same as the difference between the construction shown in FIG. 2 shown as an example of construction of the step size control circuit 41 and the construction in FIG. 5. Accordingly, when the construction shown in FIG. 16 is employed as the step size control circuit 42m, similar effect as the construction shown in FIG. 15 can be achieved.

Fifth Embodiment

Figure 17:
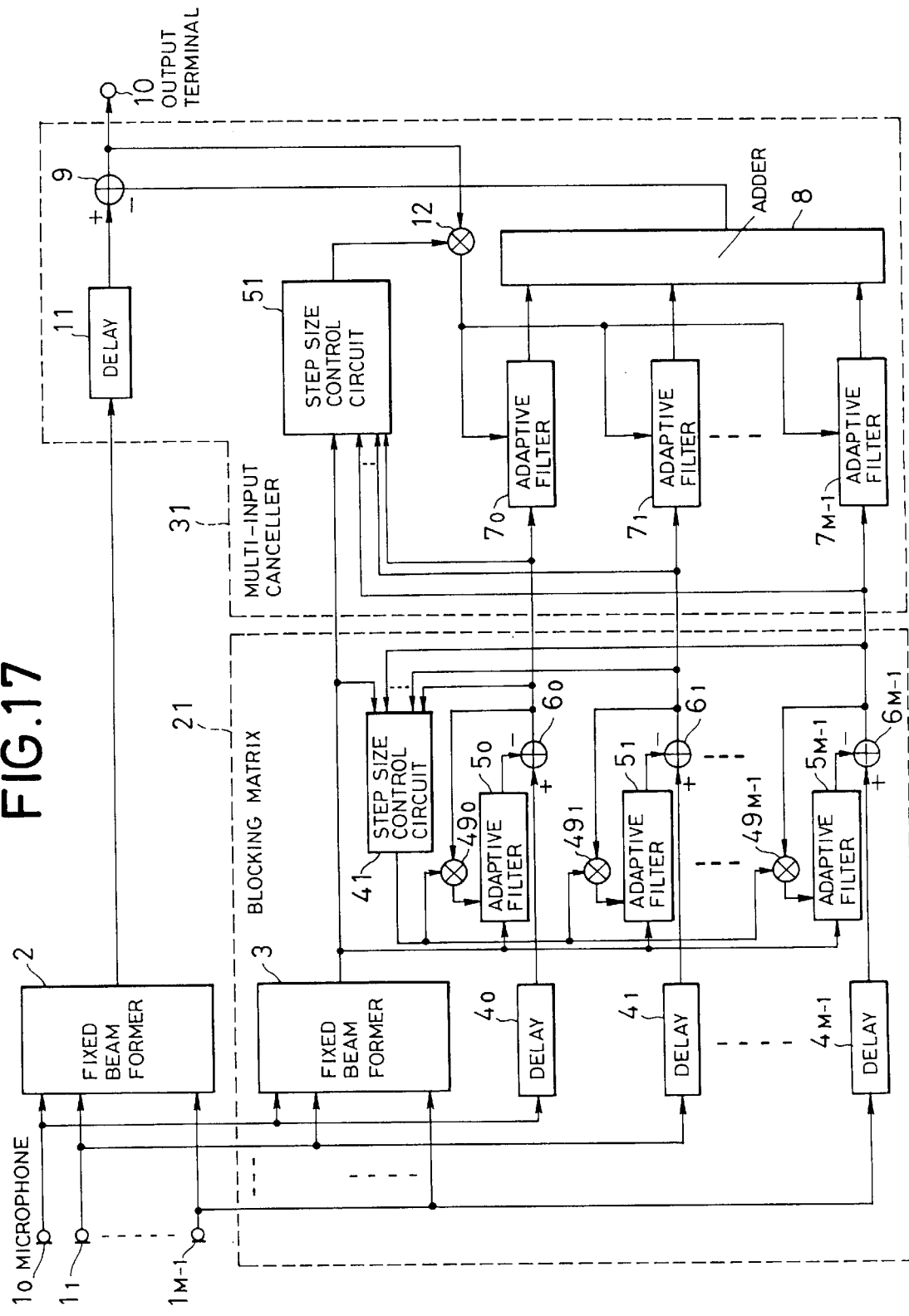
FIG. 17 is a block diagram showing a construction of the fifth embodiment of an adaptive array apparatus according to the present invention.

FIG. 17 is a block diagram of the fifth embodiment of the adaptive array apparatus according to the present invention.

The shown embodiment is constructed by replacing the blocking matrix 20 with the blocking matrix 21, with respect to the first embodiment shown in FIG. 1.

This difference is the same as the difference between the conventional adaptive array apparatus shown in FIG. 35 and the third embodiment shown in FIG. 10. Accordingly, the shown embodiment achieved the effect of the third embodiment in addition to the effect achieved by the first embodiment. Namely, in the shown embodiment, degradation of the signal and the breathing noise in the final output can be reduced, and the breathing noise due to movement of the interference signal source or the target signal source can be reduced.

Sixth Embodiment

Figure 18:
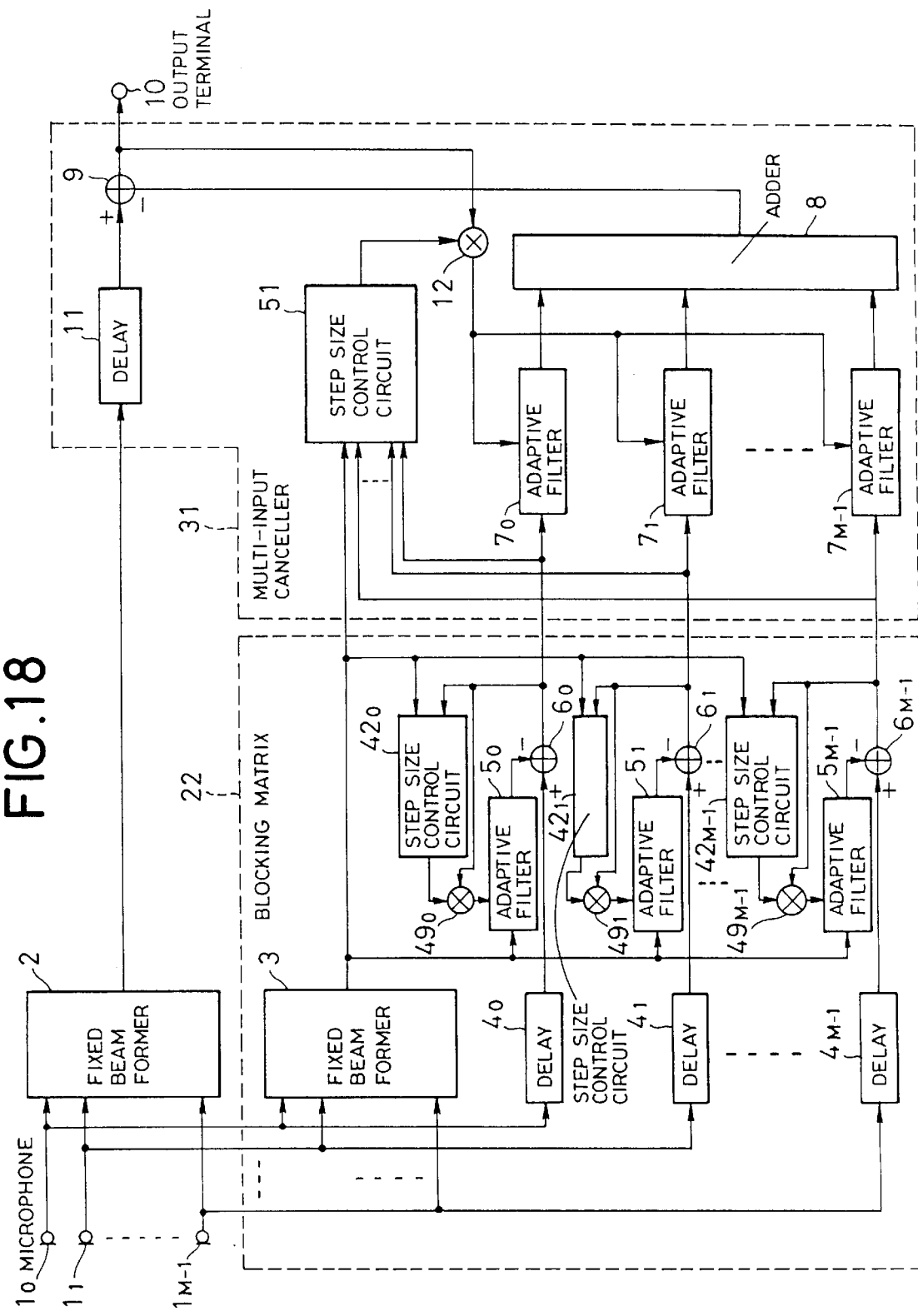
FIG. 18 is a block diagram showing a construction of the sixth embodiment of an adaptive array apparatus according to the present invention.

FIG. 18 is a block diagram of the sixth embodiment of the adaptive array apparatus according to the present invention.

The shown embodiment is constructed by replacing the blocking matrix 20 in the first embodiment shown in FIG. 1 with the blocking matrix 22. This difference is the same as the difference between the conventional adaptive array apparatus shown in FIG. 35 and the fourth embodiment of the present invention shown in FIG. 14. Accordingly, the shown embodiment achieves effect of the fourth embodiment in addition to the effect achieved by the first embodiment. Namely, in the shown embodiment, degradation of the signal and the breathing noise in the final output can be reduced, and the breathing noise due to movement of the interference signal source or the target signal source can be reduced.

Seventh Embodiment

Figure 19:
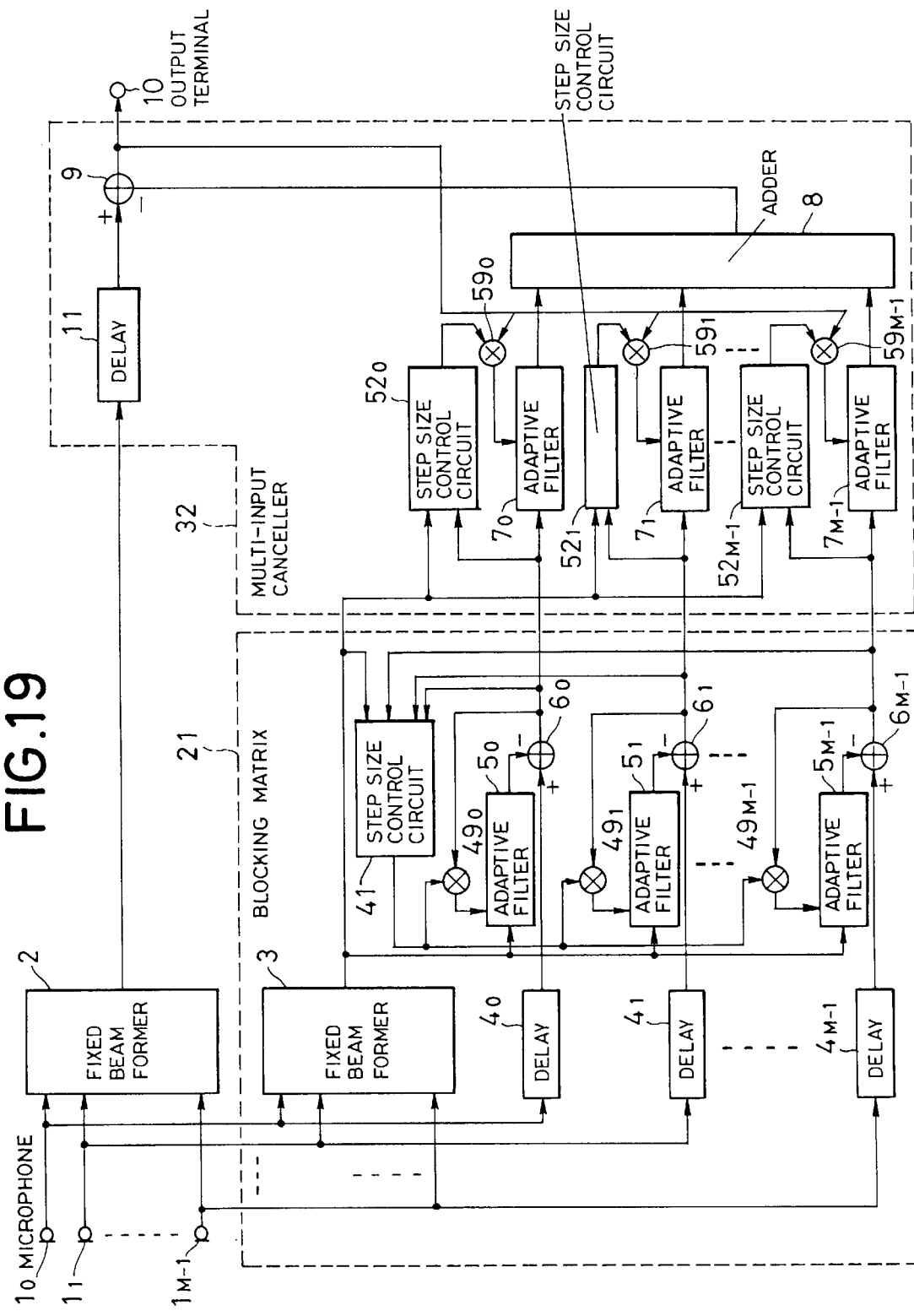
FIG. 19 is a block diagram showing a construction of the seventh embodiment of an adaptive array apparatus according to the present invention.

FIG. 19 is a block diagram of the seventh embodiment of the adaptive array apparatus according to the present invention.

The shown embodiment is constructed by replacing the blocking matrix 20 in the second embodiment shown in FIG. 7 with the blocking matrix 21. This difference is the same as the difference between the conventional adaptive array apparatus shown in FIG. 35 and the third embodiment of the present invention shown in FIG. 10. Accordingly, the shown embodiment achieves effect of the third embodiment in addition to the effect achieved by the first embodiment. Namely, in the shown embodiment, degradation of the signal and the breathing noise in the final output can be reduced, and the breathing noise due to movement of the interference signal source or the target signal source can be reduced.

Eighth Embodiment

Figure 20:
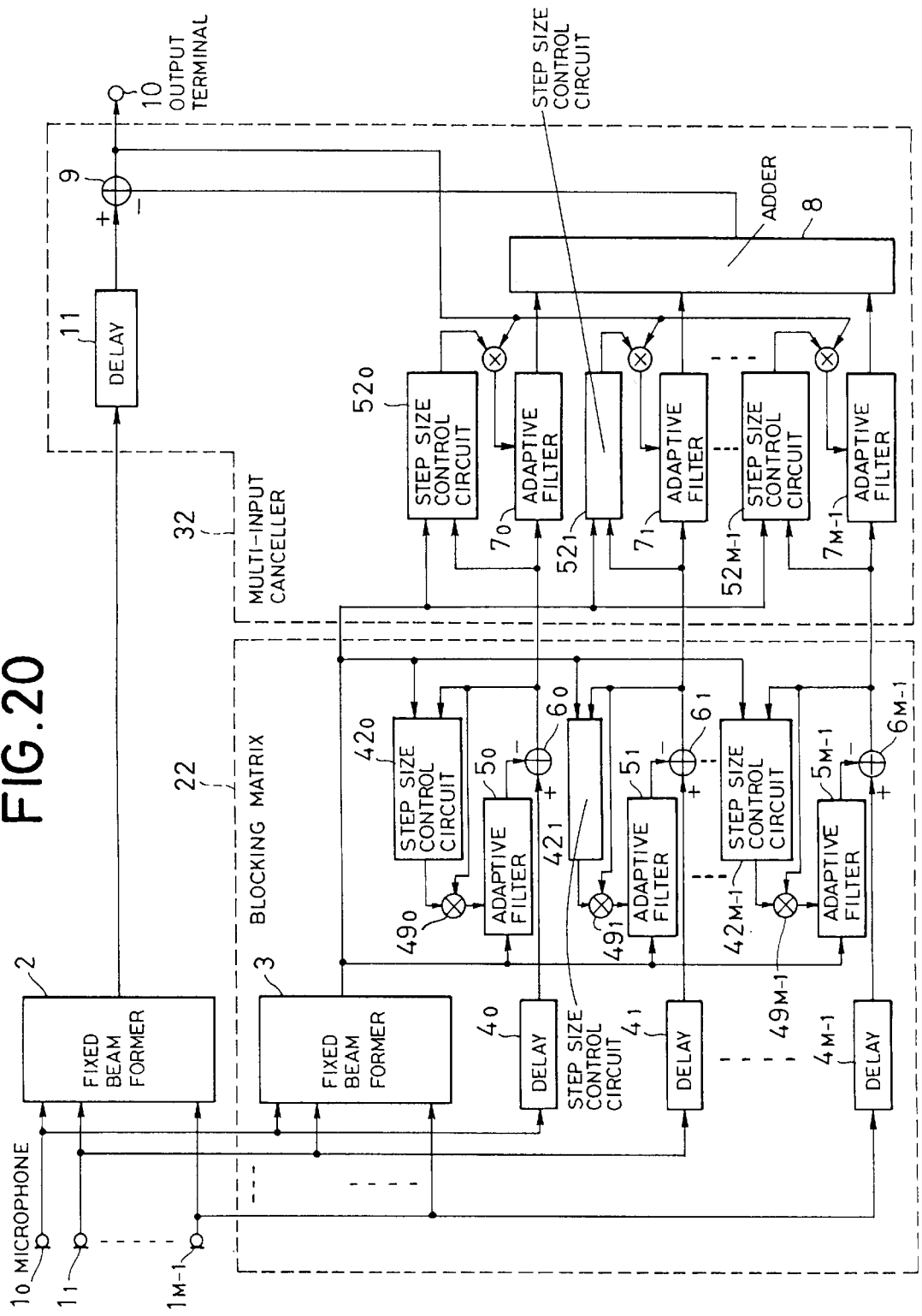
FIG. 20 is a block diagram showing a construction of the eighth embodiment of an adaptive array apparatus according to the present invention.

FIG. 20 is a block diagram of the eighth embodiment of the adaptive array apparatus according to the present invention.

The shown embodiment is constructed by replacing the blocking matrix 20 in the second embodiment shown in FIG. 7 with the blocking matrix 22. This difference is the same as the difference between the conventional adaptive array apparatus shown in FIG. 35 and the fourth embodiment of the present invention shown in FIG. 14. Accordingly, the shown embodiment achieves effect of the fourth embodiment in addition to the effect achieved by the second embodiment. Namely, in the shown embodiment, degradation of the signal and the breathing noise in the final output can be reduced, and the breathing noise due to movement of the interference signal source or the target signal source can be reduced.

Ninth Embodiment

Figure 21:
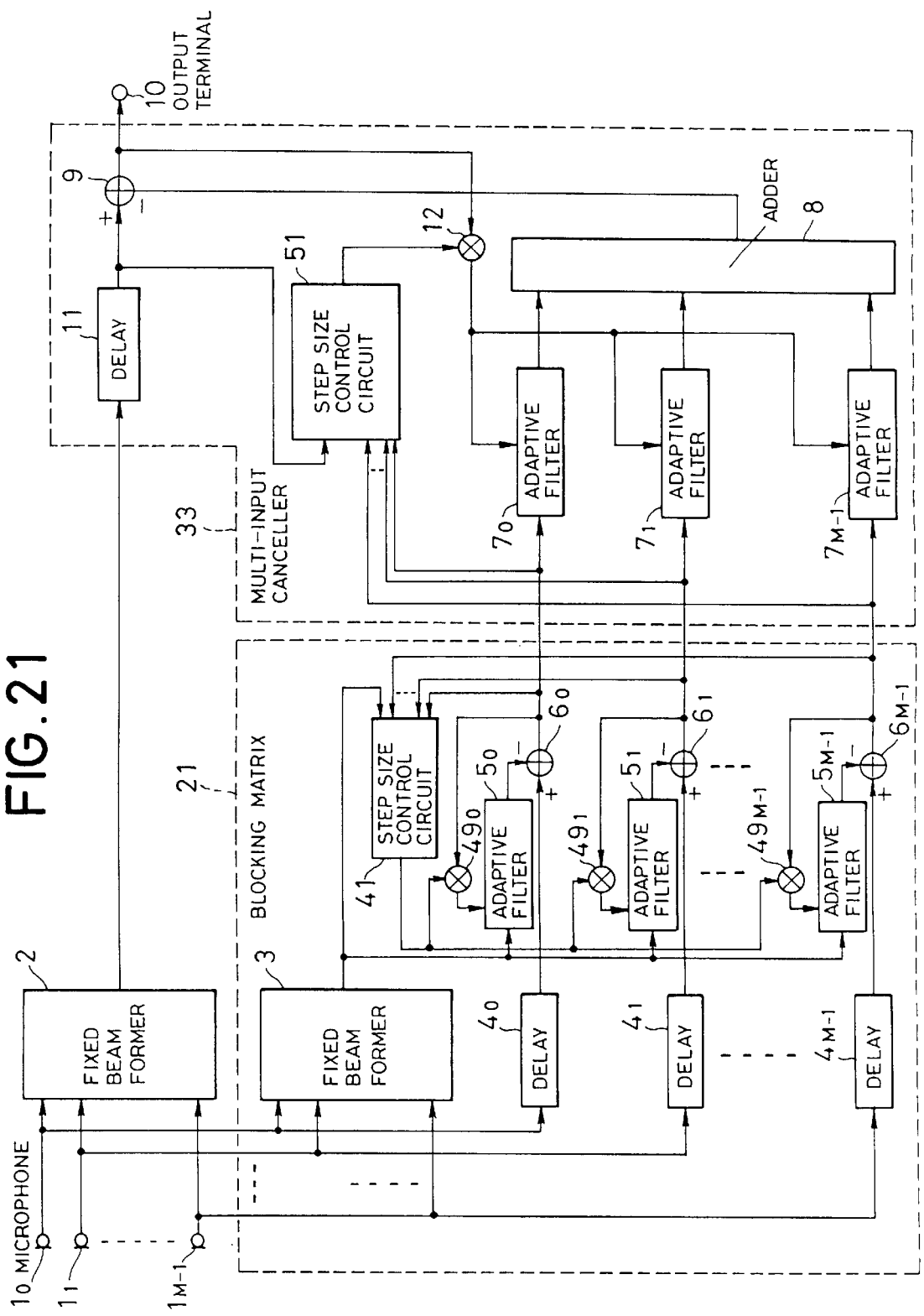
FIG. 21 is a block diagram showing a construction of the ninth embodiment of an adaptive array apparatus according to the present invention.

FIG. 21 is a block diagram showing the ninth embodiment of the adaptive array apparatus according to the present invention.

The shown embodiment is constructed by replacing the multi-input canceller 31 in the fifth embodiment shown in FIG. 17 with a multi-input canceller 33.

A difference between the multi-input canceller 31 and the multi-input canceller 33 is that one of the input signals of the step size control circuit 51 is the output signal of the fixed beam former 3 in the multi-input canceller 31, whereas the one of the input signal of the step size control circuit 51 is replaced with the output signal of the delay 11 in the multi-input canceller 33. Discussion will be given hereinafter with respect to the difference set forth above.

In the shown embodiment, one of the inputs of the step size control circuit 51 in the multi-input canceller 31 receives the output of the delay 11. Since the input signal of the delay 11 is the output signal of the fixed beam former 2, the directivity which the output of the delay 11 has is the same as the directivity of the output of the fixed beam former 2. The directivity of the fixed beam former 2 set to have high sensitivity with respect to the target signal and low sensitivity with respect to the interference signal. Accordingly, the directivity of the output of the delay 11 is similar to the directivity of the output of the fixed beam former 3. Thus, the nature of the output of the step size control circuit 51 in the shown embodiment is similar to the nature of the output of the step size control circuit 51 in the fifth embodiment. Accordingly, the ninth embodiment achieves the similar effect to that of the fifth embodiment.

Tenth Embodiment

Figure 22:
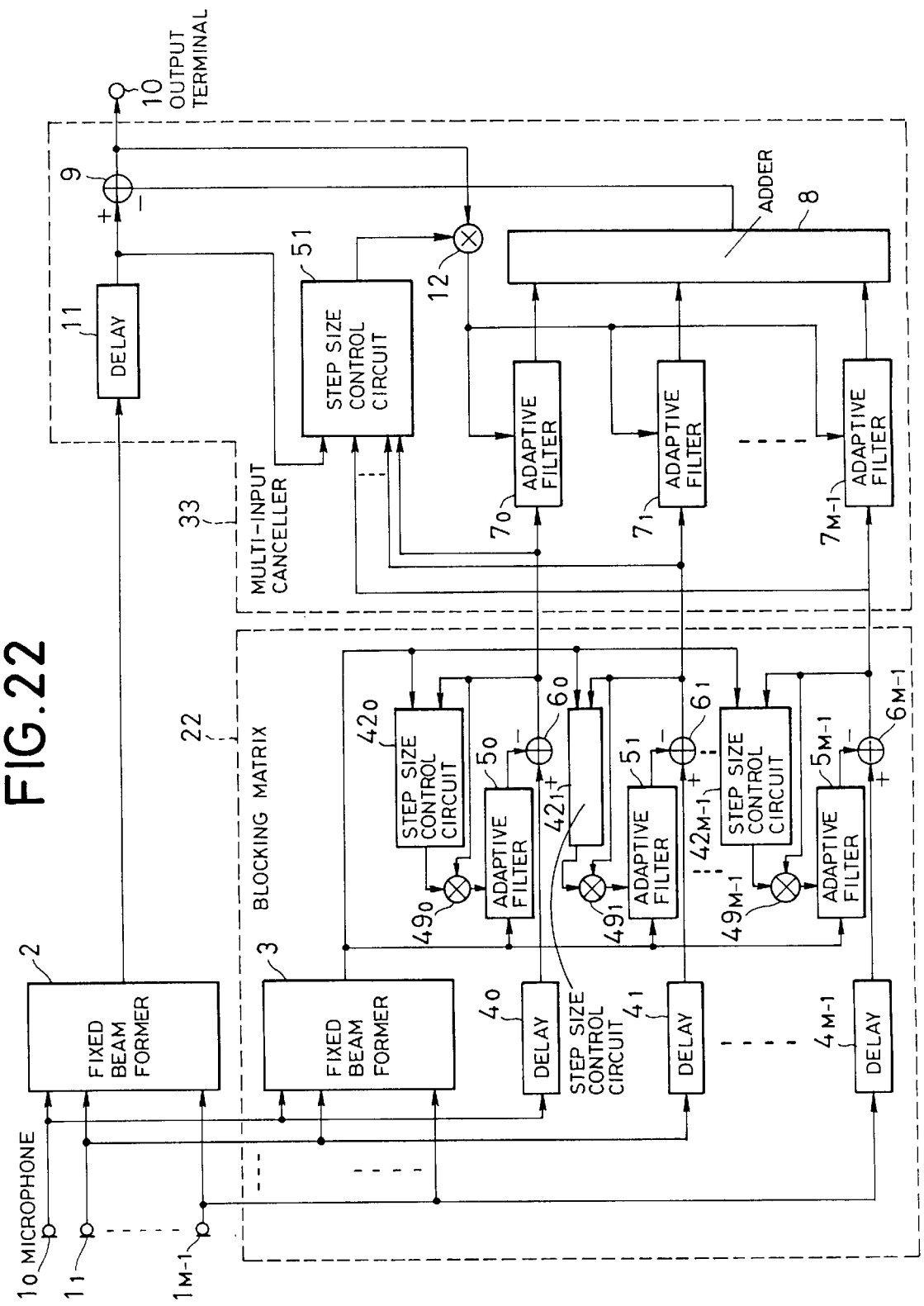
FIG. 22 is a block diagram showing a construction of the tenth embodiment of an adaptive array apparatus according to the present invention.

FIG. 22 is a block diagram showing the tenth embodiment of the adaptive array apparatus according to the present invention.

The shown embodiment is constructed by replacing the multi-input canceller 31 in the sixth embodiment shown in FIG. 18 with a multi-input canceller 33.

A difference between the multi-input canceller 31 and the multi-input canceller 33 is that one of the input signals of the step size control circuit 51 is the output signal of the fixed beam former 3 in the multi-input canceller 31, whereas the one of the input signal of the step size control circuit 51 is replaced with the output signal of the delay 11 in the ninth embodiment. This difference is similar to the difference of the ninth embodiment relative to the fifth embodiment. Accordingly, the shown embodiment achieves the similar effect achieved by the sixth embodiment.

Eleventh Embodiment

Figure 23:
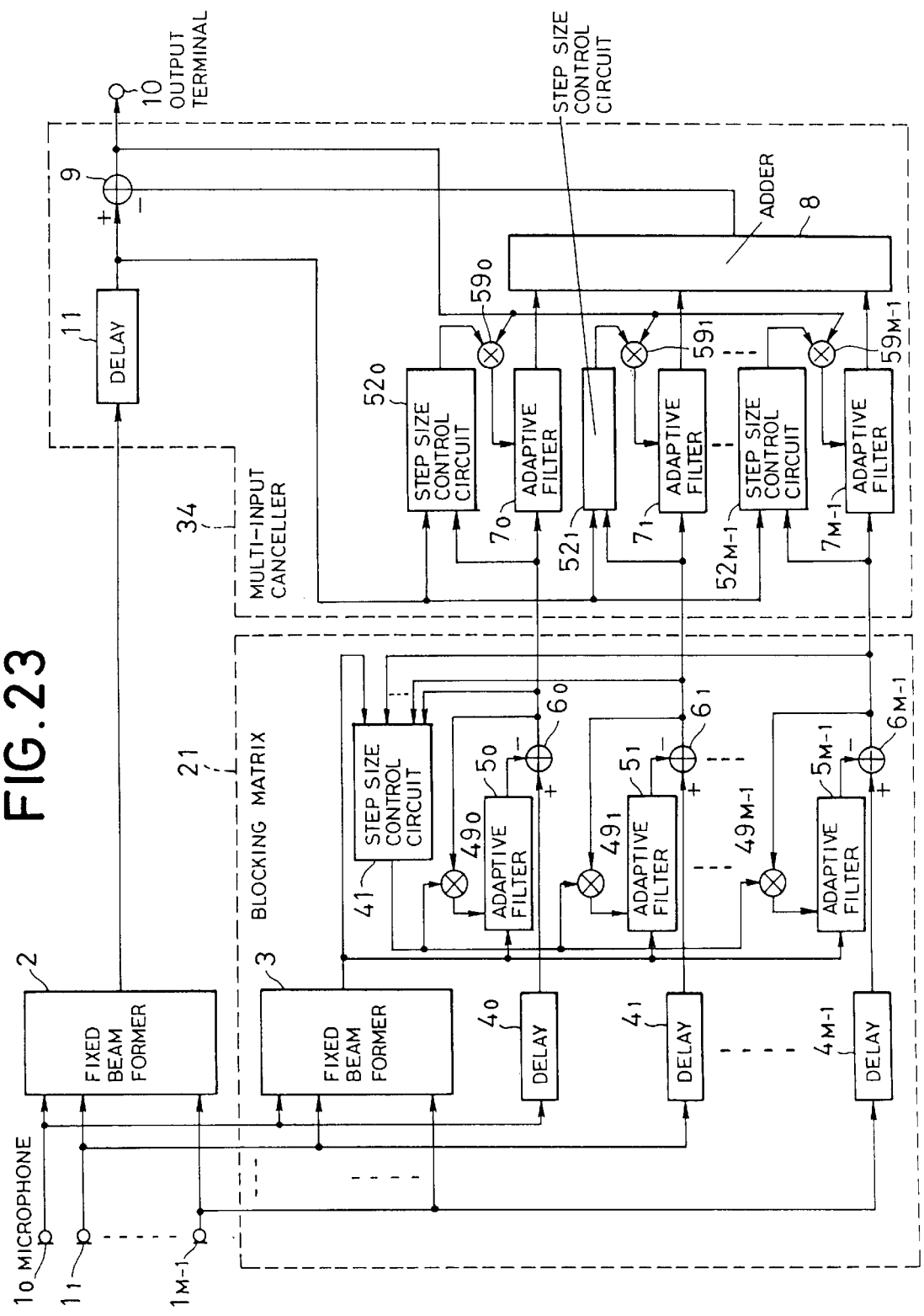
FIG. 23 is a block diagram showing a construction of the eleventh embodiment of an adaptive array apparatus according to the present invention.

FIG. 23 is a block diagram showing the eleventh embodiment of the adaptive array apparatus according to the present invention.

The shown embodiment is constructed by replacing the multi-input canceller 32 in the seventh embodiment shown in FIG. 19 with a multi-input canceller 34.

A difference between the multi-input canceller 32 and the multi-input canceller 34 is that one of the input signals of the step size control circuit $52m$ is the output signal of the fixed beam former 3 in the multi-input canceller 32, whereas the one of the input signal of the step size control circuit $52m$ is replaced with the output signal of the delay 11 in the multi-input canceller 34. As already discussed in the ninth embodiment, the output of the fixed beam former 3 and the output of the delay 11 have similar directivity. Accordingly, the shown embodiment achieves the same effect as that achieved by the seventh embodiment.

Twelfth Embodiment

Figure 24:
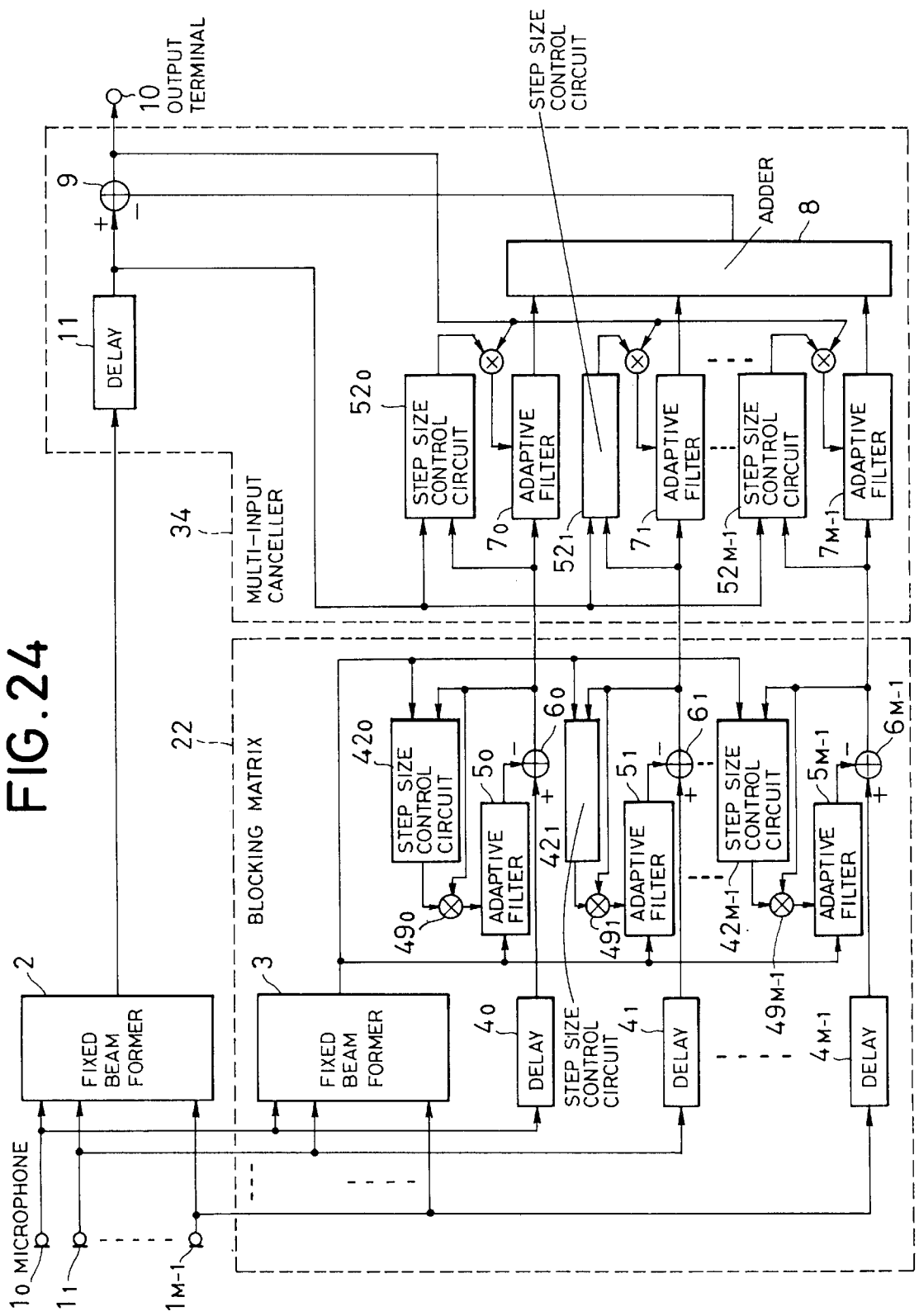
FIG. 24 is a block diagram showing a construction of the twelfth embodiment of an adaptive array apparatus according to the present invention.

FIG. 24 is a block diagram showing the twelfth embodiment of the adaptive array apparatus according to the present invention.

The shown embodiment is constructed by replacing the multi-input canceller 32 in the eighth embodiment shown in FIG. 20 with a multi-input canceller 34.

This difference is the same as the difference between the eleventh embodiment and the seventh embodiment. Accordingly, the shown embodiment achieves the same effect as that is achieved by the eighth embodiment.

Thirteenth Embodiment

Figure 25:
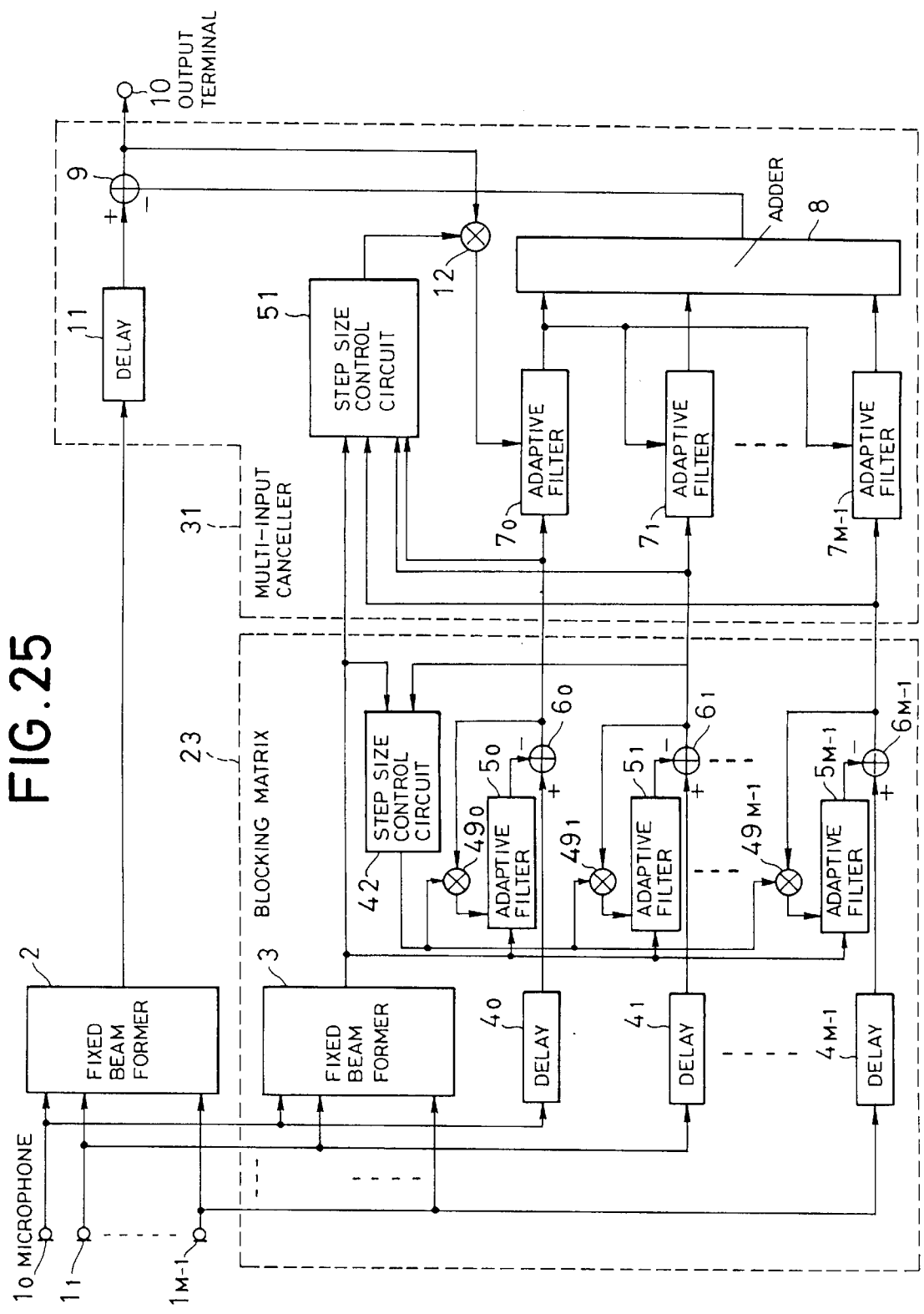
FIG. 25 is a block diagram showing a construction of the thirteenth embodiment of an adaptive array apparatus according to the present invention.

FIG. 25 is a block diagram showing the thirteenth embodiment of the adaptive array apparatus according to the present invention.

The shown embodiment is constructed by replacing the blocking matrix 21 in the fifth embodiment shown in FIG. 17 with the blocking matrix 23. The difference of the blocking matrixes will be discussed hereinafter.

The difference between the blocking matrix 23 and the blocking matrix 21 in the fifth embodiment is that one of two inputs to each multiplier $49m$ receives the output of the step size control circuit 41 in the fifth embodiment, whereas one input of each multiplier $49m$ receives the output of the step size control circuit 42. Similarly to the step size control circuit 421 in the fourth embodiment shown in FIG. 14, the step size control circuit 42 receives the output signal of the subtractor 61 and the output signal of the fixed beam former 3. Accordingly, the output of the step size control circuit 42 has similar property of the output step size control circuit 421 in the fourth embodiment shown in FIG. 14. Accordingly, the shown embodiment shown in FIG. 25 achieves the same effect as that achieved by the fifth embodiment shown in FIG. 17.

The step size control circuit 42 in FIG. 25 receives the output signal of the subtractor 61 and the output signal of the fixed beam former. However, it is also possible to receive the output signal of the arbitrary subtractor $6m$ (m=0, 1, . . . , M–1) in place of the output signal of the subtractor 61.

While the shown embodiment is constructed by replacing the blocking matrix 21 in the fifth embodiment shown in FIG. 17 with the blocking matrix 23. It is also possible to replace the blocking matrix 23 with the blocking matrix in another embodiment.

Fourteenth Embodiment

Figure 26:
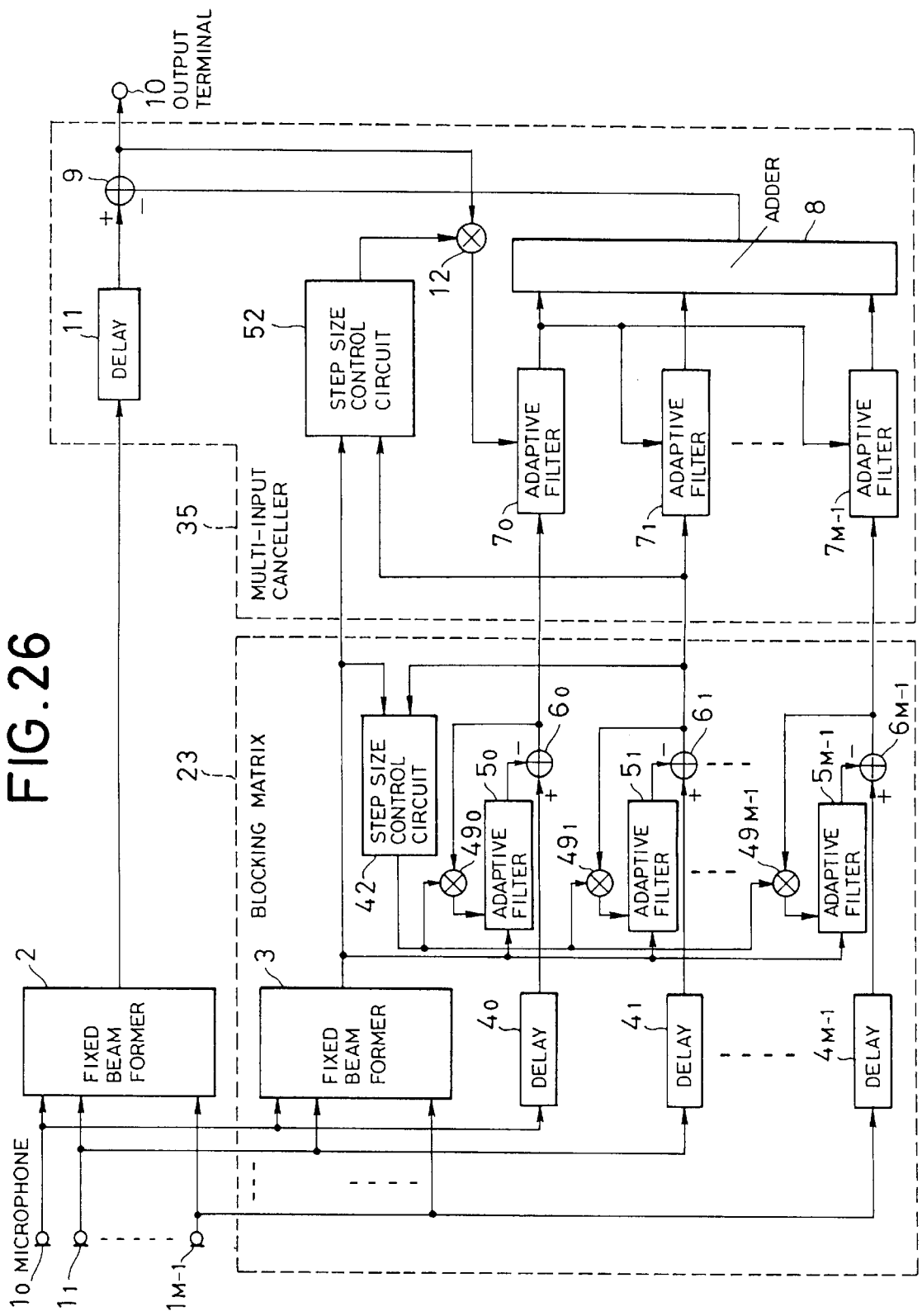
FIG. 26 is a block diagram showing a construction of the fourteenth embodiment of an adaptive array apparatus according to the present invention.

FIG. 26 is a block diagram of the fourteenth embodiment of the adaptive array apparatus according to the present invention.

The shown embodiment is constructed by replacing the multi-input canceller 31 in the thirteenth embodiment shown in FIG. 25 with the multi-input canceller 35. The difference between the multi-input cancellers will be discussed hereinafter.

A difference between the multi-input canceller 35 in the shown embodiment and the multi-input canceller 31 in the thirteenth embodiment is that one of two inputs to each multiplier 12 receives the output of the step size control circuit 51 in the thirteenth embodiment, whereas one of two inputs of the multiplier 12 receives the output of the step size control circuit 52. The step size control circuit 52 receives the output signal of the subtractor 61 and the output signal of the fixed beam former 3, similarly to the step size control circuit 521 in the seventh embodiment shown in FIG. 7. Accordingly, the output of the step size control circuit 52 in FIG. 26 has the same nature as the output of the step size control circuit 521 in the second embodiment of FIG. 7. This nature is the same as the nature of the output of the step size control circuit 51 in the thirteenth embodiment shown in FIG. 25. Accordingly, the shown embodiment shown in FIG. 26 achieves the same effect as that achieved in the thirteenth embodiment of FIG. 25. While the step size control circuit 52 of FIG. 26 receives the output signal of the subtractor 61 and the output signal of the fixed beam former 3, it is possible to receive the output signal of arbitrary subtractor 6m (m=0, 1, . . . , M−1) in place of the output signal of the subtractor 61.

While the shown embodiment replaces the multi-input canceller 31 in the thirteenth embodiment of FIG. 25 with the multi-input canceller 35, it is also possible to replace the blocking matrix in another embodiment with the multi-input canceller 35.

As set forth above, while the output signal group of the subtractor group 6m in the blocking matrix have been employed as the signals to be input in the step size control circuit of the blocking matrix and the step size control circuit of the multi-input canceller, it is possible to replace these signal group with the output signal of the beam former having lower sensitivity with respect to the target signal than that with respect to the interference signal.

Fifteenth Embodiment

Figure 27:
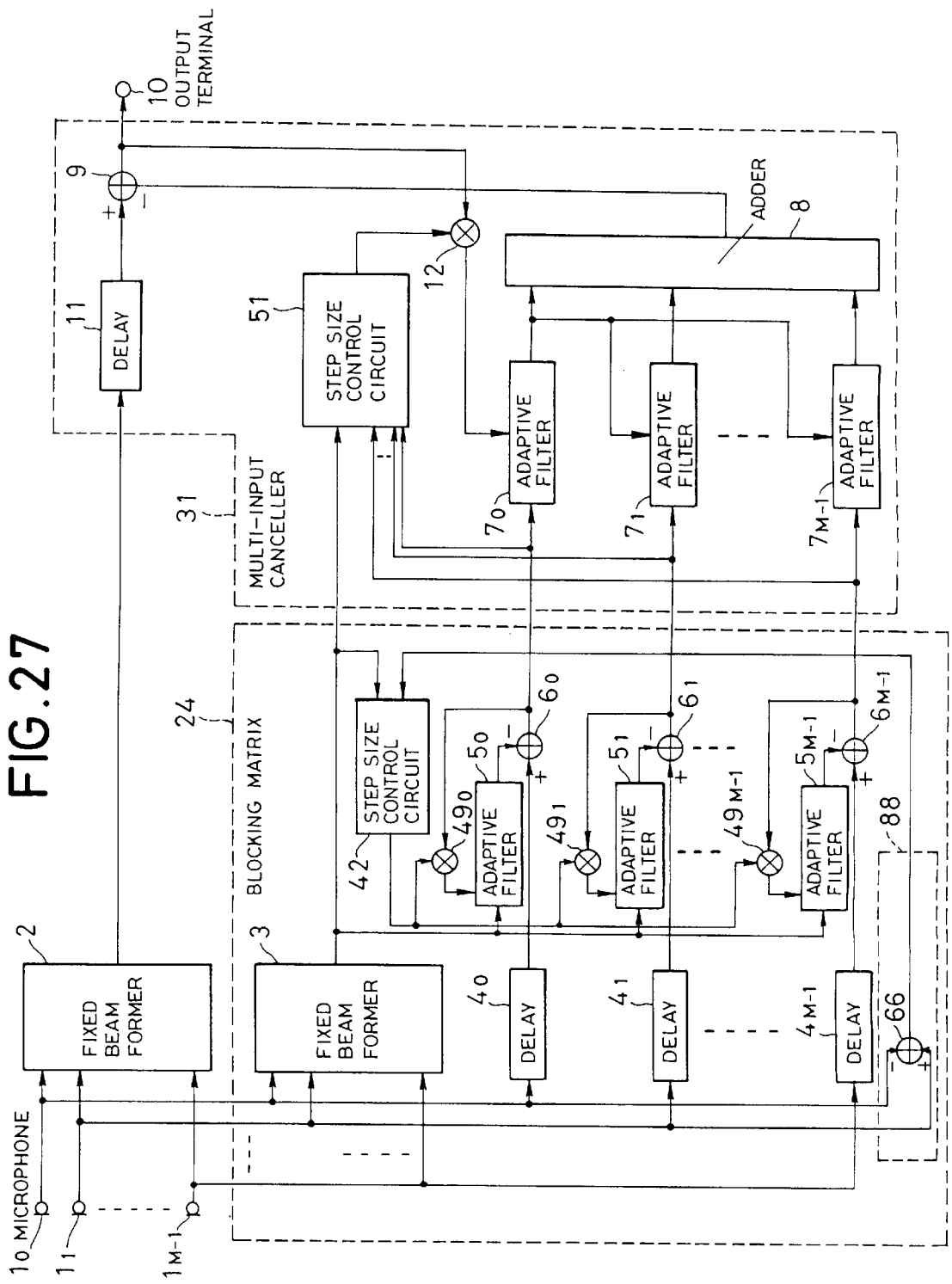
FIG. 27 is a block diagram showing a construction of the fifteenth embodiment of an adaptive array apparatus according to the present invention.

FIG. 27 is a block diagram of the fifteenth embodiment of the adaptive array apparatus according to the present invention.

The shown embodiment is constructed by replacing the blocking matrix 23 in the thirteenth embodiment of FIG. 25 with a blocking matrix 24.

A difference of the blocking matrix 24 and the blocking matrix 23 is that a fixed beam former 88 is added in the blocking matrix 24, and the signal received on one input of the step size control circuit 42 is modified from the output of the subtractor 61 to the output signal of the fixed beam former 88.

The fixed beam former 88 is constructed with the subtractor 66. The subtractor 66 receives the output signal of the microphones 10 and 11 to calculate a difference of these two signals to derive the output signal of the fixed beam former 88. The target signal arrives to the microphones 10 and 11 at substantially the same amplitude and the same phase to cancel with each other on the output signal of the fixed beam former 88. On the other hand, since the interference signal arrives at different phases to the microphones 10 and 11 to reside on the output signal of the fixed beam former 88 without canceling. Accordingly, the fixed beam former 88 has low sensitivity with respect to the target signal and high sensitivity with respect to the interference signal. This nature is similar to the output of the subtractor 61 in the thirteenth embodiment shown in FIG. 25. Accordingly, the shown embodiment has the same effect as that achieved by the thirteenth embodiment.

Sixteenth Embodiment

Figure 28:
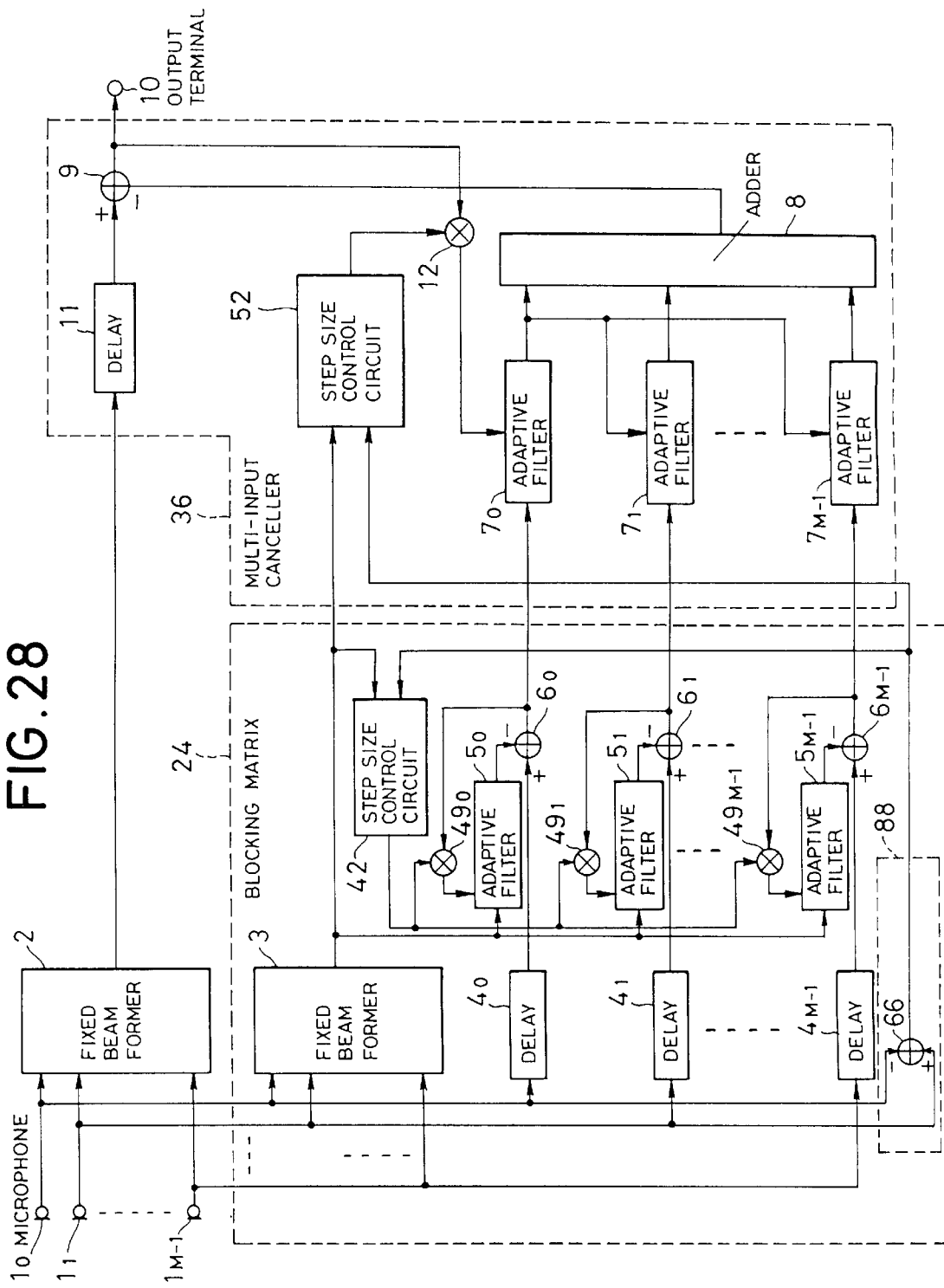
FIG. 28 is a block diagram showing a construction of the sixteenth embodiment of an adaptive array apparatus according to the present invention.

FIG. 28 is a block diagram showing the sixteenth embodiment of the adaptive array apparatus according to the present invention.

The shown embodiment is constructed by replacing the blocking matrix 23 in the fourteenth embodiment of FIG. 26 with the blocking matrix 24, and the multi-input canceller 35 with a multi-input canceller 36.

As already discussed with respect to the fifteenth embodiment shown in FIG. 27, the effect of the blocking matrix 24 is similar to that of the blocking matrix 23.

A difference of the multi-input canceller 36 and the multi-input canceller 35 is that the signal received on one input of the step size control circuit 42 is modified from the output signal of the subtractor 61 to the output signal of the fixed beam former 88. As discussed with respect to the fifth embodiment, the output of the fixed beam former 88 has the same nature as that of the output of the subtractor 01. Therefore, the effect of the multi-input canceller 36 is the same as that achieved by the multi-input canceller 35. Accordingly, the shown embodiment achieves the same effect as that achieved by the fourteenth embodiment.

While a case where NLMS algorithm is employed as an adaptive algorithm for performing updating of the tap coefficients of each adaptive filter 7m of the multi-input canceller, has been discussed, similar method can be effected even in the case where other adaptive algorithm, such as RLS algorithm, a projection algorithm, a gradient method, a least square method, a block adaptive algorithm, adaptive algorithm employing orthogonal transformation and so forth, may be used.

When the NLMS algorithm is employed, only step size is controlled. When other adaptive algorithm is employed, a parameter other than the step size can also be controlled. For example, when RLS algorithm is employed, not only the step size but also a constant called as forgetting constant can be controlled.

While the case where the leaky adaptive filter is employed as each adaptive filter 7m of the multi-input canceller has been discussed above, a tap coefficients constrained adaptive filter, a normed constrained adaptive filter and so forth may be employed other than the leaky adaptive filter.

As a filter structure of each adaptive filter 7m of the multi-input canceller, a case where FIR filter is employed has been discussed. However, it is also possible to employ an IIR filter, a lattice filter and so forth other than the FIR filter.

While a case where NLMS algorithm is employed as an adaptive algorithm for performing updating of the tap coefficients of each adaptive filter 5m of the blocking matrix, has been discussed, similar method can be effected even in the case where other adaptive algorithm, such as an LMS algorithm, a RLS algorithm, a projection algorithm, a gradient method, a least square method, a block adaptive algorithm, adaptive algorithm employing orthogonal transformation and so forth, may be used.

While only step size is controlled when the NLMS algorithm is employed, when other adaptive algorithm is employed, the parameter other than the step size can be a controlled. For example, when the RLS algorithm is employed, not only step size but also the constant called as forgetting constant can be controlled.

While the case where the leaky adaptive filter is employed as each adaptive filter 5m of the blocking matrix has been discussed above, a tap coefficients constrained adaptive filter, a normed constrained adaptive filter and so forth may be employed other than the leaky adaptive filter.

As a filter structure of each adaptive filter 5m of the blocking matrix , a case where FIR filter is employed has been discussed. However, it is also possible to employ an IIR filter, a raster filter and so forth other than the FIR filter.

A case where a delay and sum beam former is employed as construction of the fixed beam former 2 and the fixed beam former 3, various construction, such as a filter and sum beam former and so forth can be employed.

When the directivity of the fixed beam former 2 can have the same directivity as the fixed beam former 3, the fixed beam former 2 and the fixed beam former 3 can be used in common.

As a construction of the publication 2 has been discussed as a construction of the adaptive array, the construction of the publications 1, 2, 4, 5 and so forth is employed as the adaptive array, similar method can be employed.

Seventeenth Embodiment

Figure 29:
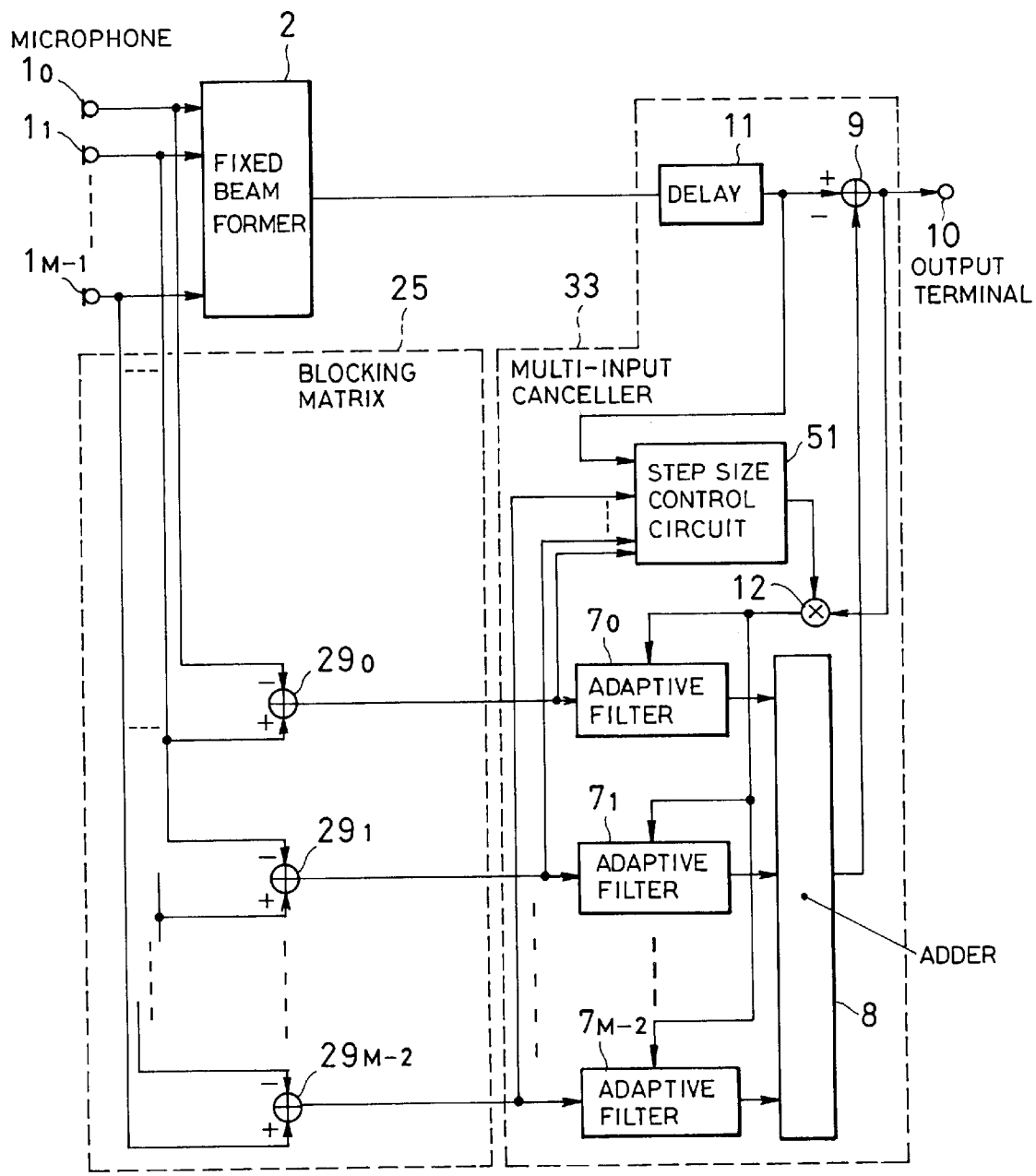
FIG. 29 is a block diagram showing a construction of the seventeenth embodiment of an adaptive array apparatus according to the present invention.

FIG. 29 is a block diagram of the seventeenth embodiment of the adaptive array apparatus according to the present invention.

The shown embodiment shows a construction for the case where the present invention is applied for the construction of the publication 1.

A difference between FIG. 29 and FIG. 21 is only that the blocking matrix 21 in FIG. 21 is replaced with the blocking matrix 25. Discussion will be given hereinafter with respect to the blocking matrix 25.

The blocking matrix 25 in FIG. 29 is constructed with a subtractor group 29m. The subtractor 29m receives output signals of adjacent microphones to output a subtracted signal to transmit to the corresponding adaptive filter 7m in the multi-input canceller 33. Since the target signal is obtained in the same phase and the same amplitude at the outputs of respective microphones 1m, the output of the subtractor 29m does not contain the target signal. This nature is the same as the output signal of the blocking matrix shown in FIG. 21. Accordingly, the operation of overall construction of FIG. 29 is similar to the operation of the overall construction of FIG. 21. At the output terminal 10, the target signal is extracted to obtain the signal, in which the interference signal is suppressed. Accordingly, the effect of the present invention in FIG. 29 is the same as that achieved in FIG. 21.

The present invention is applicable for the Frost beam former disclosed in the foregoing publication 4. In the publication 4, the adaptive algorithm with linear constraint is employed for updating the tap coefficients. The step size and forgetting constant in this adaptive algorithm may be controlled by the output of the step size control circuit (e.g. the step size control circuit 51 in FIG. 1) having the same nature as that discussed above.

While the foregoing has been discussed in terms of the case where the time-average of the instantaneous square value is employed, it is also possible to employ a time-average of an instantaneous absolute value, a time-average of an absolute value of an instantaneous cubic value, a time-average of an instantaneous biquadratic value and so forth in place of the time-average of the instantaneous square value.

Figure 30:
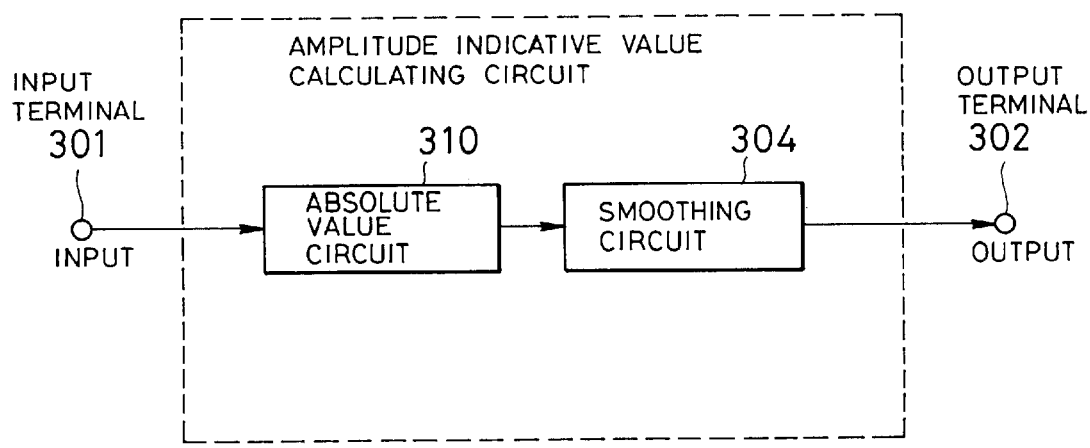
FIG. 30 is an illustration showing another embodiment of the amplitude indicative value calculating circuit.
Figure 31:
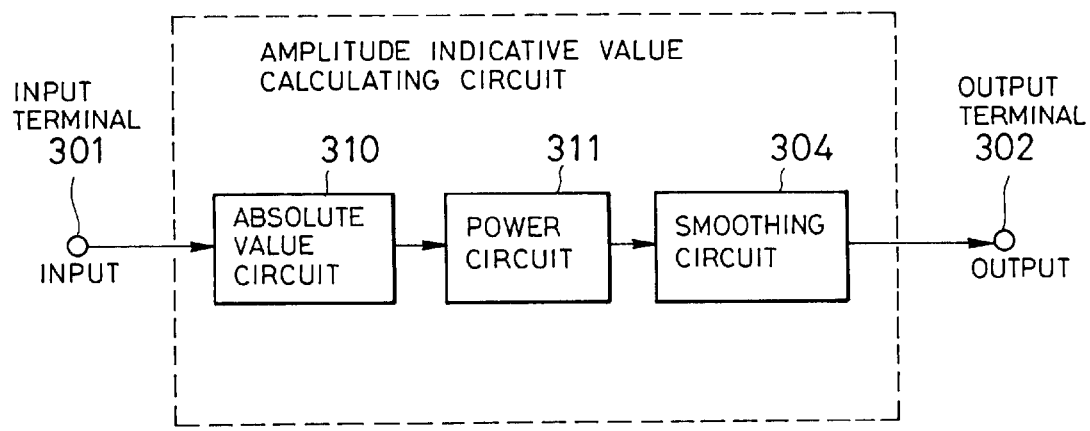
FIG. 31 is an illustration showing a further embodiment of the amplitude indicative value calculating circuit.

FIG. 30 shows a construction of the amplitude indicative value calculating circuit in the case where the time-average of the instantaneous absolute value is employed. Different from FIG. 3, FIG. 31 shows a construction of the amplitude indicative value calculating circuit in the case where the time-average of the instantaneous value of certain order power is employed. For monotone increasing with respect to the magnitude of the amplitude of the signal is employed, time-average of the instantaneous value of certain order power can be employed in place of the time-average of the instantaneous square value as the amplitude indicative value.

The discussion has been given for the case where the target signal source, the interference signal and other signal source are sufficiently distant from a line on which the microphones are aligned. Even when the target signal source, the interference signal and other signal source are not sufficiently distant from a line on which the microphones are aligned. When the fixed beam formers 2, 3 and 88 are designed the sensitivity with respect to the target sound source becomes higher than the sensitivity for other sound source, similar effect can be obtained.

While discussion has been given for the case where the microphone array is arranged in equal interval on the line, similar principle can be applied for the case where the arrangement of the microphone is not equal interval, where the microphones are arranged on the curved line, on a plain, a curved surface or three-dimensionally.

In the case where the sensor array is employed as the fixed beam former, similar method can be used even in the case where the directivity is provided for the microphone per se.

Eighteenth Embodiment

Figure 32:
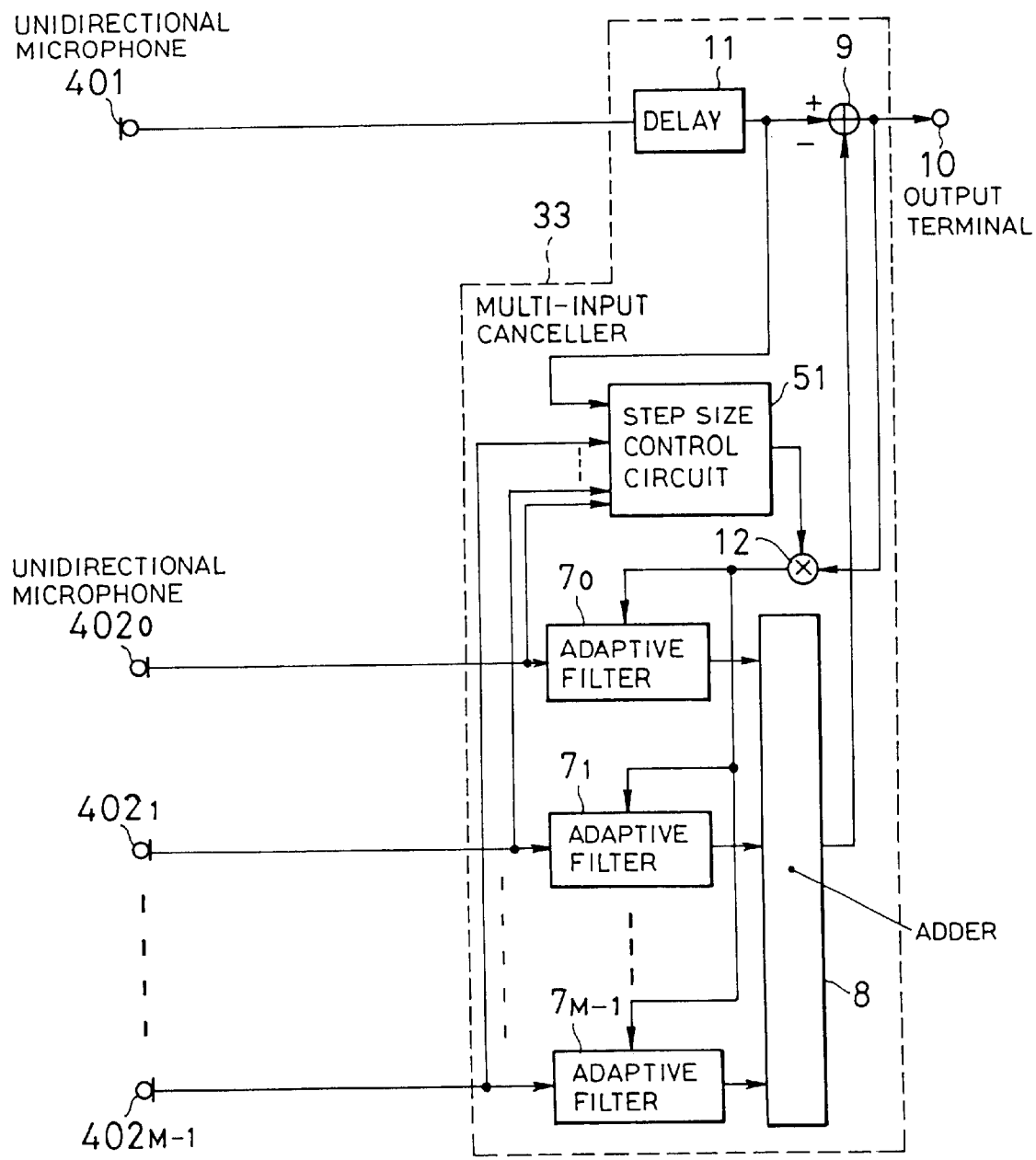
FIG. 32 is a block diagram showing a construction of the eighteenth embodiment of an adaptive array apparatus according to the present invention.

FIG. 32 is a block diagram of the eighteenth embodiment of the adaptive array apparatus according to the present invention.

The shown embodiment is constructed by employing a unidirectional microphone in order to obtain the output signal of the fixed beam former and the output signal of the blocking matrix.

In the construction shown in FIG. 32, the output signal of the fixed beam former 2 in the seventh embodiment shown in FIG. 29 is replaced with the output signal of the unidirectional microphone 401. The output signal group of the subtractor group 29m is replaced with the output signal of the unidirectional microphone group 402m. A difference between the construction shown in FIG. 32 and the construction shown in FIG. 29 are only foregoing two points. Therefore, the discussion will be given hereinafter with respect to the foregoing two different points.

The unidirectional microphone 401 is directed the direction having particularly high sensitivity in the directivity to the arriving direction of the target signal. In the output signal of the unidirectional microphone 401, the target signal is enhanced. This output signal has the same nature as the output signal of the fixed beam former 2 in the seventeenth embodiment shown in FIG. 29.

The unidirectional microphone 402m is directed the direction having particularly low sensitivity in the directivity to the arriving direction of the target signal. In the output signal of the unidirectional microphone 402m, the target signal is not included, but other signals except for the target signal are included. This output signal has the same nature as the output signal group of the subtractor group 29m in the seventeenth embodiment shown in FIG. 29.

While the case where the microphones are employed as sensors has been discussed, ultrasonic sensors, sonar receivers, antennas and so forth may be employed other than the microphones.

As set forth above, according to the present invention, degradation of the signal or breathing noise in the final output can be effectively suppressed and breathing noise due to movement of the interference signal source can also be effectively suppressed.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. An adaptive array apparatus employing an adaptive filter for receiving a particular signal source as a target signal source, among a plurality of signal sources, comprising:

means for deriving a first indicative value relating to an amplitude of an output signal of a first beam former having higher sensitivity with respect to said target signal source than a sensitivity with respect to other signal sources;

means for deriving a second indicative value relating to an amplitude of an output signal of a second beam former having lower sensitivity with respect to said target signal source than a sensitivity with respect to other signal sources; and means for determining a step size of an adaptive algorithm in said adaptive filter on the basis of said first and second indicative values.

2. An adaptive array apparatus as set forth in claim 1, wherein each of said first and second indicative values relating to said signal amplitude is an average value of a square of the signal.

3. An adaptive array apparatus as set forth in claim 1, wherein each of said first and second indicative values relating to said signal amplitude is an average value of an absolute value of the signal.

4. An adaptive array apparatus as set forth in claim 1, wherein each of said first and second indicative values relating to said signal amplitude is an average value of a given power order of the signal.

5. An adaptive array apparatus having a generalized side lobe canceller type construction and having an adaptive filter for receiving a specific signal source as a target signal source among a plurality of signal sources, comprising:

means for deriving a first indicative value relating to an amplitude of an output signal of a first beam former having higher sensitivity with respect to said target signal source than a sensitivity with respect to other signal sources;

means for deriving a second indicative value relating to an amplitude of an output signal of a second beam former having lower sensitivity with respect to said target signal source than a sensitivity with respect to other signal sources;

means for deriving a step size determining value proportional to a value derived by converting a division of said first indicative value by said second indicative value with a non-linear function; and means for determining a step size of an adaptive algorithm in an adaptive filter provided in a multi-input canceller on the basis of said step size determining value.

6. An adaptive array apparatus as set forth in claim 5, wherein said non-linear function is a step function.

7. An adaptive array apparatus as set forth in claim 5, wherein said non-linear function is a diode function.

8. An adaptive array apparatus as set forth in claim 5, wherein said non-linear function is a polynomial function.

9. A control method of an adaptive array employing an adaptive filter for receiving a particular signal source as a target signal source, among a plurality of signal sources, comprising the steps of:

determining a first indicative value relating to an amplitude of an output signal of a first beam former having higher sensitivity with respect to said target signal source than a sensitivity with respect to other signal sources;

determining a second indicative value relating to an amplitude of an output signal of a second beam former having lower sensitivity with respect to said target signal source than a sensitivity with respect to other signal sources; and determining a step size of an adaptive algorithm in said adaptive filter based on said indicative values.

10. An adaptive array apparatus employing an adaptive filter for receiving a particular signal source as a target signal source, among a plurality of signal sources, comprising:

means for deriving a first indicative value relating to an amplitude of an output signal of a first beam former having higher sensitivity with respect to said target signal source than a sensitivity with respect to other signal sources;

means for deriving a second indicative value relating to an amplitude of an output signal of a second beam former having lower sensitivity with respect to said target signal source than a sensitivity with respect to other signal sources; and means for determining a step size of an adaptive algorithm in said adaptive filter on the basis of a ratio of said first and second indicative values.

11. An adaptive array apparatus employing an adaptive filter for receiving a particular signal source as a target signal source, among a plurality of signal sources, comprising:

means for deriving a first indicative value relating to an amplitude of an output signal of a first beam former having higher sensitivity with respect to said target signal source than a sensitivity with respect to other signal sources;

means for deriving a second indicative value relating to an amplitude of an output signal of a second beam former having lower sensitivity with respect to said target signal source than a sensitivity with respect to other signal sources;

means for comparing said first indicative value and a value derived by multiplying said second indicative value with a constant; and means for determining a step size of an adaptive algorithm in said adaptive filter on the basis of a result of the comparison of said first and second indicative values.

12. An adaptive array apparatus having a generalized side lobe canceller type construction and having an adaptive filter for receiving a specific signal source as a target signal source among a plurality of signal sources, comprising:

means for deriving a first indicative value relating to an amplitude of an output signal of a first beam former having higher sensitivity with respect to said target signal source than a sensitivity with respect to other signal sources;

means for deriving a second indicative value relating to an amplitude of an output signal of a second beam former having lower sensitivity with respect to said target signal source than a sensitivity with respect to other signal sources;

means for comparing said first indicative value and a value derived by multiplying said second indicative value with a constant; and means for determining a step size of an adaptive algorithm in said adaptive filter provided in a multi-input canceller on the basis of the result of comparison.

13. An adaptive array apparatus having a generalized side lobe canceller type construction and having an adaptive filter for receiving a specific signal source as a target signal source among a plurality of signal sources, comprising:

means for deriving a first indicative value relating to an amplitude of an output signal of a first beam former having higher sensitivity with respect to said target signal source than a sensitivity with respect to other signal sources;

means for deriving a second indicative value relating to an amplitude of an output signal of a second beam former having lower sensitivity with respect to said target signal source than a sensitivity with respect to other signal sources;

means for comparing said first indicative value and a value derived by multiplying said second indicative value with a constant; and means for determining a step size of an adaptive algorithm in said adaptive filter provided in a blocking matrix on the basis of the result of the comparison.

14. An adaptive array apparatus having a generalized side lobe canceller type construction and having an adaptive filter for receiving a specific signal source as a target signal source among a plurality of signal sources, comprising:

means for deriving a first indicative value relating to an amplitude of an output signal of a first beam former having higher sensitivity which respect to said target signal source than a sensitivity with respect to other signal sources;

means for deriving a second indicative value relating to an amplitude of an output signal of a second beam former having lower sensitivity with respect to said target signal source than a sensitivity with respect to other signal sources;

means for comparing said first indicative value and a value derived by multiplying said second indicative value with a constant; and means for determining step sizes of adaptive algorithms in adaptive filters provided in a multi-input canceller and a blocking matrix on the basis of the result of the comparison.

15. An adaptive array apparatus having a generalized side lobe canceller type construction and having an adaptive filter for receiving a specific signal source as a target signal source among a plurality of signal sources, comprising:

means for deriving a first indicative value relating to an amplitude of an output signal of a first beam former having lower sensitivity with respect to said target signal source than a sensitivity with respect to other signal sources;

means for deriving a second indicative value relating to an amplitude of an output signal of a second beam former having higher sensitivity with respect to said target signal source than a sensitivity with respect to other signal sources;

means for deriving a step size determining value proportional to a value derived by converting a division of said first indicative value by said second indicative value with a non-linear function; and means for determining a step size of an adaptive algorithm in an adaptive filter provided in a blocking matrix on the basis of said step size determining value.

16. An adaptive array apparatus having a generalized side lobe canceller type construction and having an adaptive filter for receiving a specific signal source as a target signal source among a plurality of signal sources, comprising:

means for deriving a first indicative value relating to an amplitude of an output signal of a first beam former having lower sensitivity with respect to said target signal source than a sensitivity with respect to other signal sources;

means for deriving a second indicative value relating to an amplitude of an output signal of a second beam former having higher sensitivity with respect to said target signal source than a sensitivity with respect to other signal sources;

means for deriving a step size determining value proportional to a value derived by converting a division of said first indicative value by said second indicative value with a non-linear function; and means for determining step sizes of adaptive algorithms in adaptive filters provided in a multi-input canceller and a blocking matrix on the basis of said step size determining value.

17. A control method for an adaptive array apparatus employing an adaptive filter and an iterative least square algorithm for receiving a particular signal source as a target signal source, among a plurality of signal sources, comprising the steps of:

deriving a first indicative value relating to an amplitude of an output signal of a first beam former having higher sensitivity with respect to said target signal source than a sensitivity with respect to other signal sources;

deriving a second indicative value relating to an amplitude of an output signal of a second beam former having lower sensitivity with respect to said target signal source than a sensitivity with respect to other signal sources; and determining a step size of an adaptive algorithm in said adaptive filter and a forgetting constant on the basis of said first and second indicative values.

18. An adaptive array apparatus employing an adaptive filter and an iterative least square algorithm for receiving a particular signal source as a target signal source, among a plurality of signal sources, comprising:

means for deriving a first indicative value relating to an amplitude of an output signal of a first beam former having higher sensitivity with respect to said target signal source than a sensitivity with respect to other signal sources;

means for deriving a second indicative value relating to an amplitude of an output signal of a second beam former having lower sensitivity with respect to said target signal source than a sensitivity with respect to other signal sources; and means for determining a step size of an adaptive algorithm in said adaptive filter and a forgetting constant on the basis of said first and second indicative values.

19. An adaptive array apparatus which receives a plurality of input signals and outputs a target signal among the plurality of signals, the apparatus comprising:

a first beam former which receives the plurality of input signals and produces a first output signal, the first beam former having higher sensitivity with respect to the target signal than a sensitivity with respect to other signals;

a blocking matrix including a second beam former, the second beam former receives the plurality of input signals and produces a second output signal, the second beam former having higher sensitivity with respect to the target signal than a sensitivity with respect to other signals;

the blocking matrix further including a first set of adaptive filters which receive the input signals and output adaptive filter output signals corresponding to beam formers having lower sensitivity with respect to, the target signal than a sensitivity with respect to other signals;

the blocking matrix further including a first step size control circuit which compares the second output signal with the adaptive filter outputs signals and determines step sizes of adaptive algorithms in the first set of adaptive filters in the blocking matrix;

a multi-input canceller including a second step size control circuit, the second step size control circuit compares the output of the second beam former and the adaptive filter output signals, and determines step sizes of adaptive algorithms in a second set of adaptive filters in the multi-input canceller;

a subtractor which subtracts the outputs from the second set of adaptive filters of the multi-input canceller from the first outputs the target signal.

* * * * *